United States Patent
Moriwaki et al.

(10) Patent No.: US 11,139,651 B2
(45) Date of Patent: Oct. 5, 2021

(54) IMAGING PANEL AND IMAGING PANEL SUBSTRATE ASSEMBLY

(71) Applicant: SHARP KABUSHIKI KAISHA, Sakai (JP)

(72) Inventors: Hiroyuki Moriwaki, Sakai (JP); Makoto Nakazawa, Sakai (JP); Akinori Kubota, Sakai (JP); Fumiki Nakano, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/831,604

(22) Filed: Mar. 26, 2020

(65) Prior Publication Data

US 2020/0313429 A1    Oct. 1, 2020

(30) Foreign Application Priority Data

Mar. 27, 2019 (JP) .............................. JP2019-060487

(51) Int. Cl.
*G01T 1/20* (2006.01)
*H02H 9/04* (2006.01)
*H01L 27/146* (2006.01)
*G01T 1/208* (2006.01)

(52) U.S. Cl.
CPC ............. *H02H 9/046* (2013.01); *G01T 1/208* (2013.01); *G01T 1/2018* (2013.01); *H01L 27/14636* (2013.01); *H01L 27/14663* (2013.01); *H01L 27/14692* (2013.01)

(58) Field of Classification Search
CPC ............. H02H 9/046; H01L 27/14663; H01L 27/14636; H01L 27/14692; H01L 27/14612; H01L 27/14609; G01T 1/208; G01T 1/2018

See application file for complete search history.

(56) References Cited

U.S. PATENT DOCUMENTS

2009/0302202 A1* 12/2009 Sato .................. H01L 27/14609
250/208.1

FOREIGN PATENT DOCUMENTS

JP    2009-290171 A    12/2009

* cited by examiner

*Primary Examiner* — Kiho Kim
(74) *Attorney, Agent, or Firm* — ScienBiziP, P.C.

(57) ABSTRACT

An imaging panel includes multiple photoelectric conversion elements respectively mounted in multiple pixels defined by multiple gate lines and data lines formed on a substrate. The imaging panel further includes, outside pixel regions defined by the pixels, multiple first non-linear elements respectively connected to the data lines, multiple first protective wiring respectively connected to the data lines, and a first common wiring connected to the first non-linear elements. Each of the first non-linear elements is connected in a reverse-biased state between the data line connected to the first non-linear element and the first common wiring. Each of the first protective wiring extends to the edge of the substrate.

13 Claims, 23 Drawing Sheets

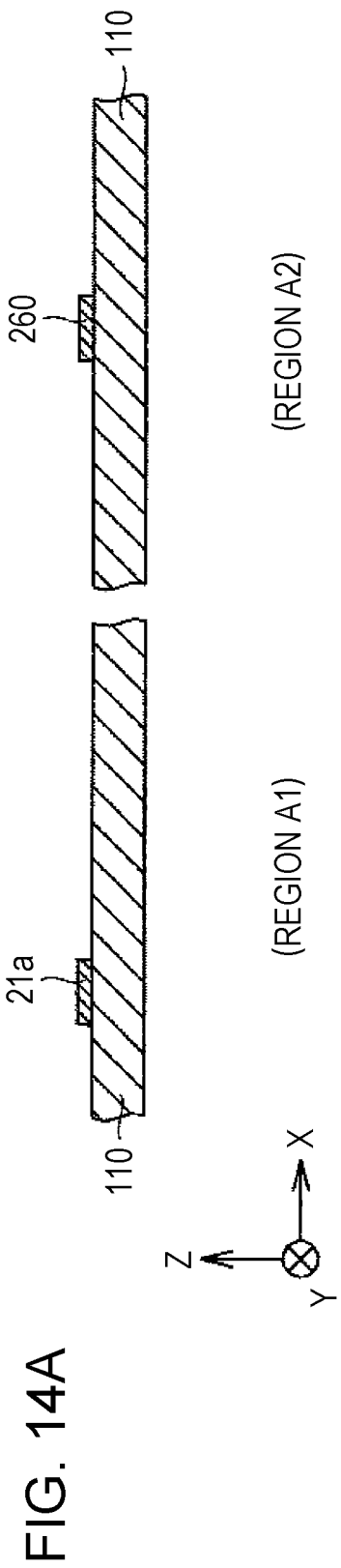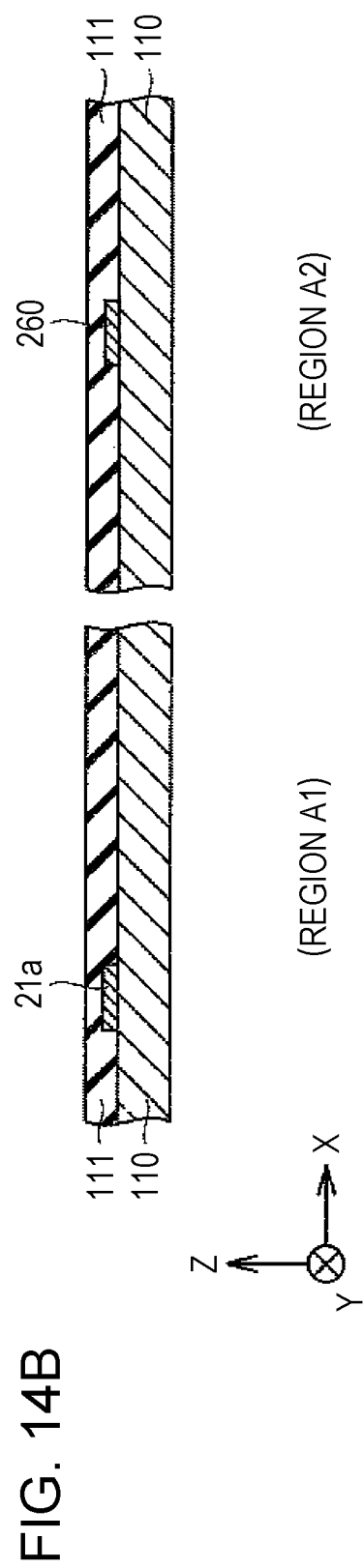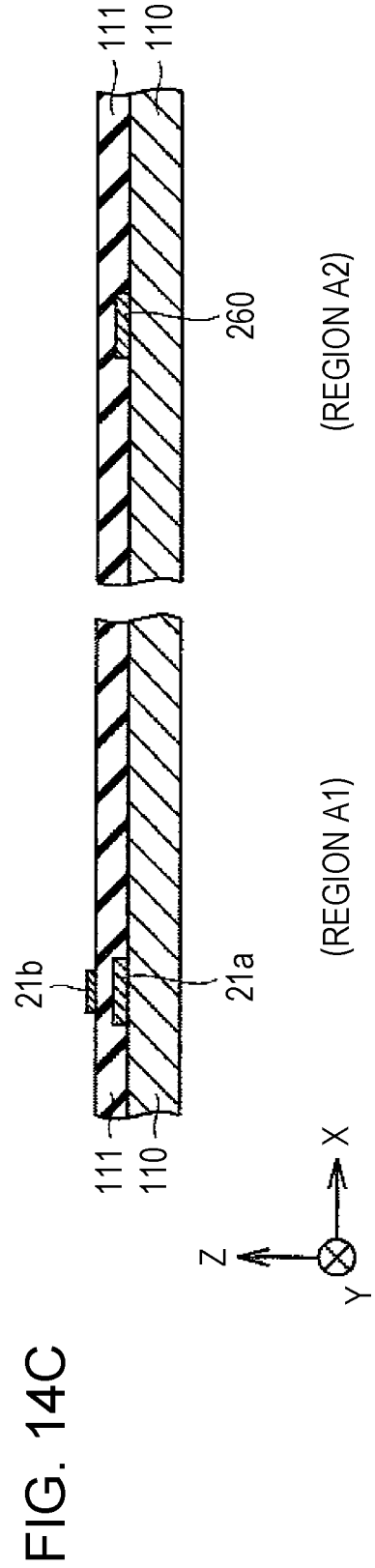

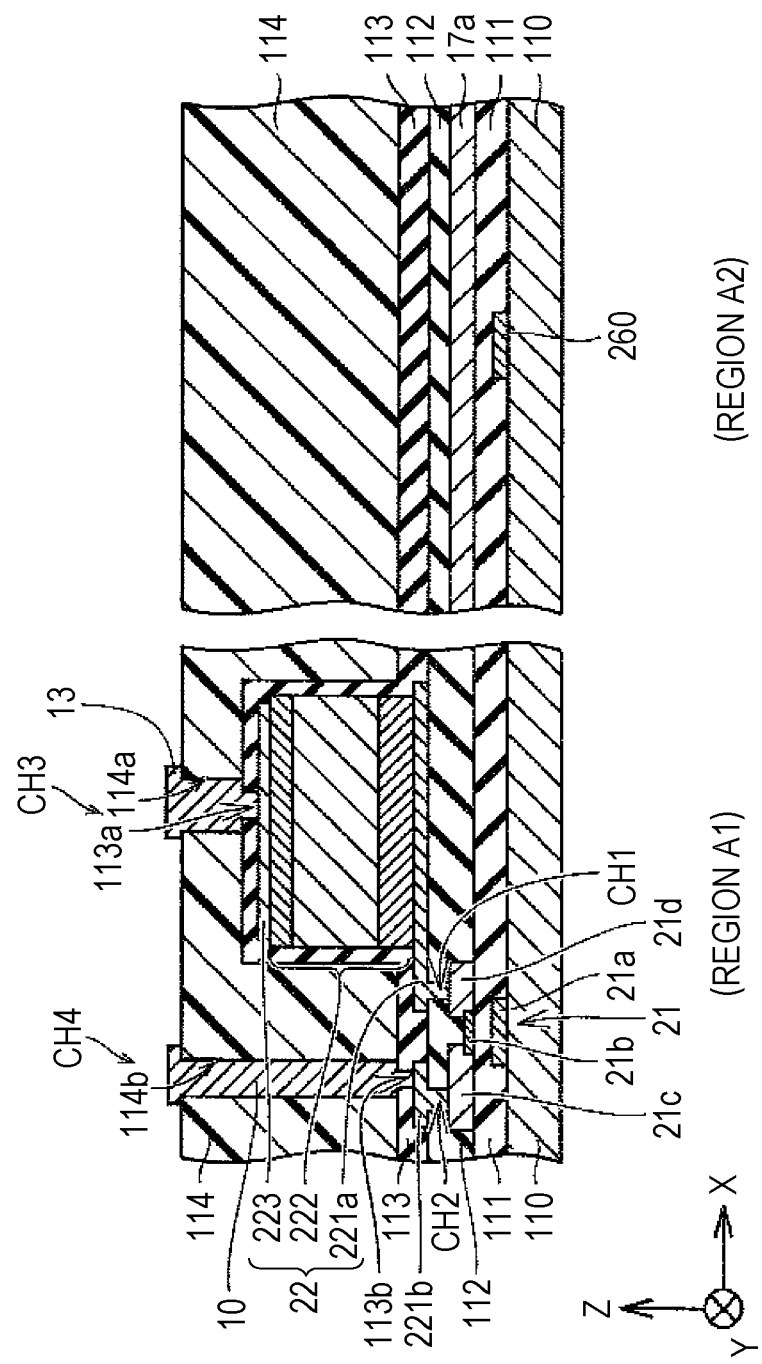

IMAGING PANEL AND IMAGING PANEL SUBSTRATE ASSEMBLY

BACKGROUND

1. Field

The present disclosure relates to an imaging panel and an imaging panel substrate assembly.

2. Description of the Related Art

Japanese Unexamined Patent Application Publication No. 2009-290171 discloses a technique of protecting a solid-state imaging device from static electricity. The solid-state imaging device includes scan lines, data lines, bias lines, high-voltage line, first static protective circuit, and second static protective circuit. The high-voltage line, first static protective circuit, and second static protective circuit are arranged external to an imaging region. The first static protective circuit is arranged for the scan lines. The second static protective circuit is arranged for the data lines. The high-voltage line is supplied with a voltage higher than a voltage for the data lines. The second static protective circuit includes a non-linear element that is connected in a reverse-biased state between the data line and the high-voltage line and a non-linear element that connected in a reverse-biased state between the data line and the high-voltage line. Since the bias lines and the high-voltage lines are supplied with voltages such that the non-linear element in the second static protective circuit are reverse-biased, the solid-state imaging device may reduce a leakage current from the data lines.

The voltages of the bias lines and high-voltage lines may be in an unfixed state in a manufacturing process of the solid-state imaging device. In such a case, the non-linear element in the second static protective circuit may be forward-biased or reverse-biased depending on the voltages of the bias line and high-voltage line. If static electricity is induced on a date line with the non-linear element in the second static protective circuit reversed-biased in the manufacturing process, the static electricity is difficult to be drained via the second static protective circuit, possibly leading to static breakdown.

It is desirable to provide a technique that makes the imaging panel to be less susceptible to static breakdown during or after the manufacturing process.

SUMMARY

According to an aspect of the disclosure, there is provided an imaging panel. The imaging panel includes a substrate, multiple gate lines mounted on the substrate, multiple data lines crossing the gate lines, multiple photoelectric conversion elements respectively mounted in multiple pixels defined by the gate lines and the data lines, multiple first non-linear elements that are mounted outside pixel regions defined by the pixels on the substrate and are respectively connected to the data lines, multiple first protective wirings mounted outside the pixel regions on the substrate and having first ends respectively connected to the data lines, and a first common wiring connected to the first non-linear elements. Each of the first non-linear elements is connected in a reverse-biased state between the data line connected to the first non-linear element and the first common wiring and the first protective wirings extend toward and have second ends at or near an edge of the substrate.

BRIEF DESCRIPTION OF THE DRAWINGS

FIG. 14A is a sectional view illustrating a manufacturing process of a region A1 of a pixel and a region A2 outside an imaging area in the imaging panel substrate assembly of the eighth embodiment wherein a gate electrode is formed in the region A1 and a first protective wiring is formed in the region A2;

FIG. 14B is a sectional view illustrating the substrate in FIG. 14A on which an inorganic insulating film is formed;

FIG. 14C is a sectional view illustrating the substrate in FIG. 14B on which oxide semiconductor is formed;

FIG. 14K is a sectional view illustrating the substrate in FIG. 14J on which a bias line and a data line are formed in the region A1;

DESCRIPTION OF THE EMBODIMENTS

Figure 1:
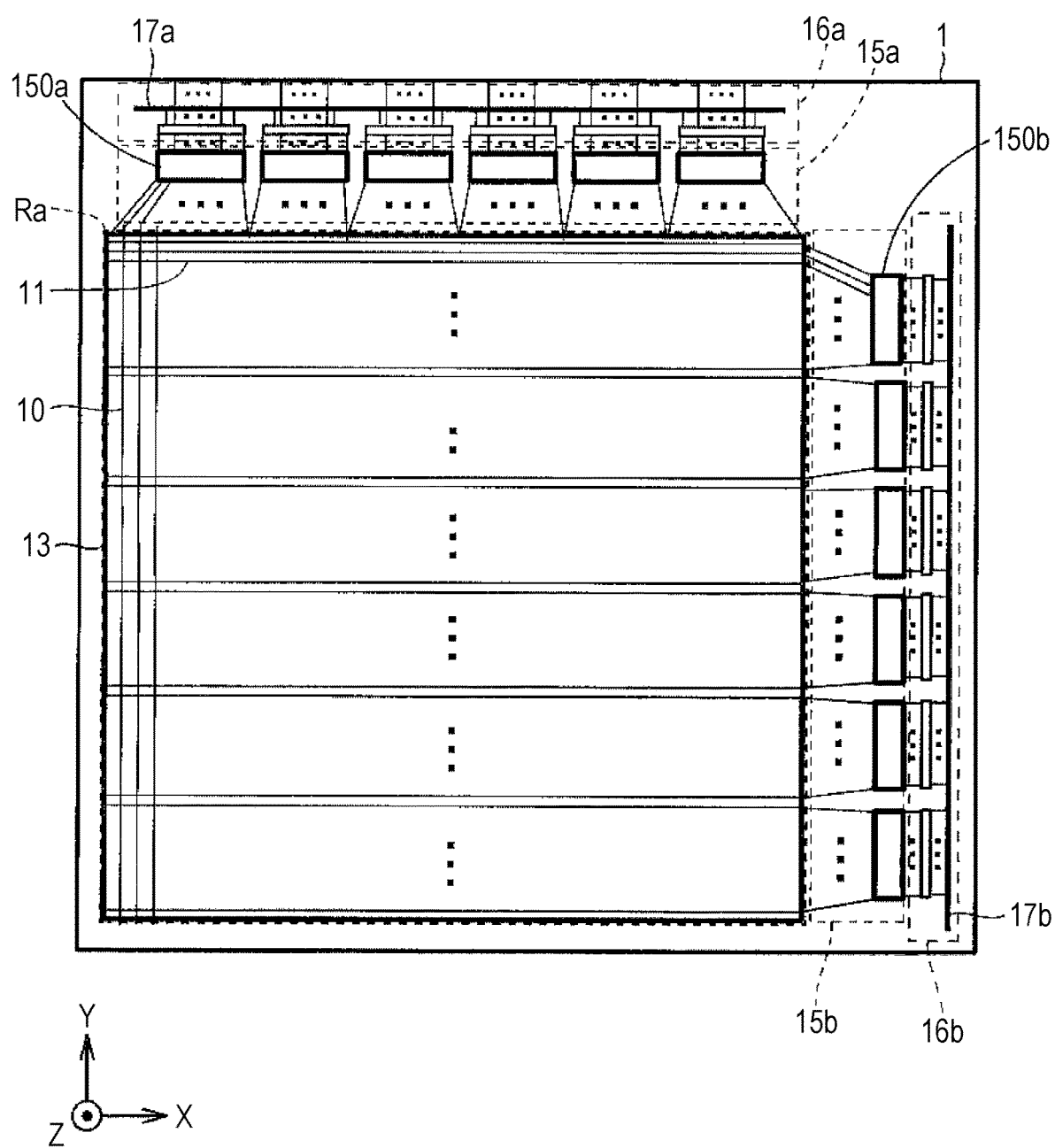
FIG. 1 is a schematic plan view illustrating an imaging panel of a first embodiment.

Embodiments of the disclosure are described in detail with reference to the drawings. Identical or equivalent elements are designated with the same reference numerals and the discussion thereof is not repeated.

First Embodiment

FIG. 1 is a schematic plan view illustrating an imaging panel of a first embodiment. An imaging panel 1 is used for X-ray imaging. The imaging panel 1 includes scintillators (not illustrated in FIG. 1) on a side thereof that is irradiated with X-rays. The scintillator converts X-rays having transmitted through a subject into fluorescence (scintillation light). The imaging panel 1 converts the scintillation light into charges and outputs the charges. The configuration of the imaging panel 1 is specifically described below.

The imaging panel 1 includes multiple data lines 10, multiple gate lines 11 crossing the data lines 10, and an imaging region Ra including regions (hereinafter referred to as pixels) surrounded by the data lines 10 and the gate lines 11.

A bias wiring 13 arranged along the inner side of the imaging region Ra surrounds the imaging region Ra. A branch bias wiring (not illustrated) connected to the bias wiring 13 is arranged for each pixel.

A protective circuit region 16a and a terminal region 15a including multiple terminal tabs 150a are arranged in the end portion of the data lines 10 outside the imaging region Ra. Of the area outside the imaging region Ra, an area along end portions of the gate lines 11 includes a protective circuit region 16b and a terminal region 15b having multiple terminal tabs 150b. Each of these regions is described below.

Figure 2:
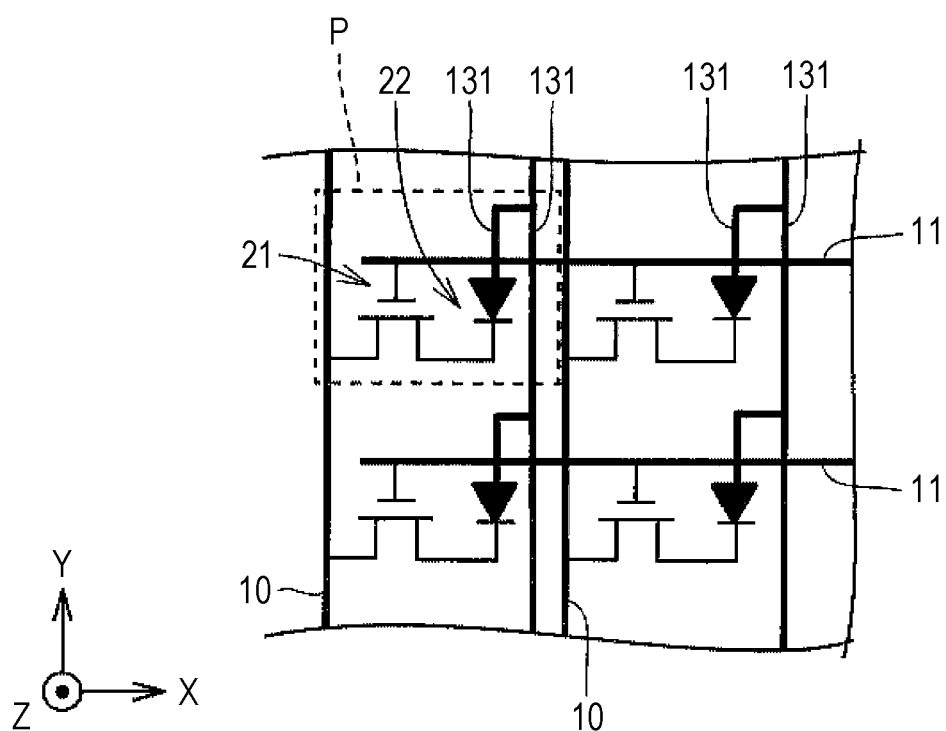
FIG. 2 is an equivalent circuit diagram of a pixel in the imaging panel in FIG. 1.

The structure of the pixels in the imaging region Ra is described herein. FIG. 2 is an equivalent circuit diagram illustrating the configuration of each pixel P. Referring to FIG. 2, the pixel P includes a thin-film transistor (TFT) 21 and a photoelectric conversion element 22.

The photoelectric conversion element 22 has a PIN photodiode and a pair of electrodes (a cathode electrode and an anode electrode). The source of the TFT 21 is connected to the data line 10 and the drain of the TFT 21 is connected to the cathode electrode of the photoelectric conversion element 22. The anode electrode of the photoelectric conversion element 22 is connected to a branch bias wiring 131 via a contact hole arranged in an insulating film (not illustrated).

The branch bias wiring 131 includes a primary wiring running in parallel with the data line 10 and a secondary wring branched from the primary wiring and the anode electrode of the photoelectric conversion element 22 is connected to the secondary wiring. The primary wiring of the branch bias wiring 131 may be designed to run in parallel with the gate line 11. The branch bias wiring 131 may be arranged in a slit.

The imaging panel 1 is connected to a driving circuit that scans the gate lines 11 and a reading circuit that reads from the data line 10 a charge into which the photoelectric conversion element 22 converts the scintillation light (although such a connection configuration is not illustrated in FIG. 1). The reading circuit applies a predetermined voltage to the data lines 10. When the TFT 21 connected to the gate line 11 scanned by the driving circuit is turned on, the reading circuit receives via the data line 10 an electrical signal responsive to the charge into which the photoelectric conversion element 22 of the pixel having the TFT 21 has converted the scintillation light.

The terminal regions 15a and 15b and the protective circuit regions 16a and 16b of the first embodiment are described below.

Figure 3A:
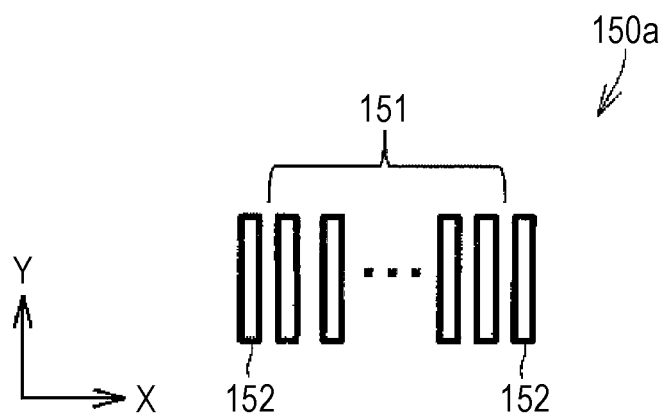
FIG. 3 illustrates one terminal region of the imaging panel.
FIG. 3B illustrates another terminal region different from the terminal region in FIG. 3A.
Figure 3B:
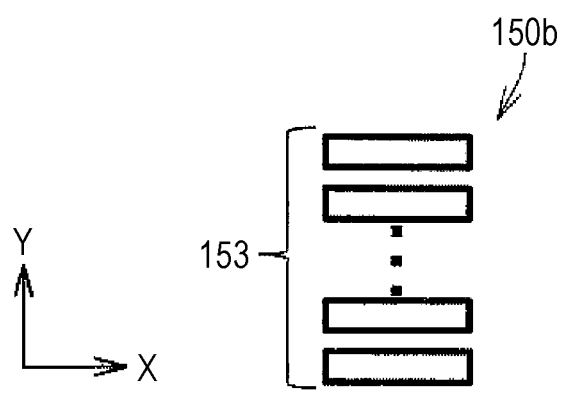

FIG. 3A illustrates the structure of the terminal tabs 150a in the terminal region 15a and FIG. 3B illustrates the structure of the terminal tabs 150b in the terminal region 15b.

Referring to FIG. 3A, the terminal tabs 150a includes a predetermined number of data terminals 151 and bias terminals 152 extended in a X axis direction. The data terminals 151 are respectively connected to the corresponding data lines 10 and the bias terminals 152 are connected to the bias wiring 13.

Referring to FIG. 3B, the terminal tabs 150b include a predetermined number of gate terminals 153 extended in a Y axis direction. The gate terminals 153 are respectively connected to the corresponding gate lines 11.

Figure 4A:
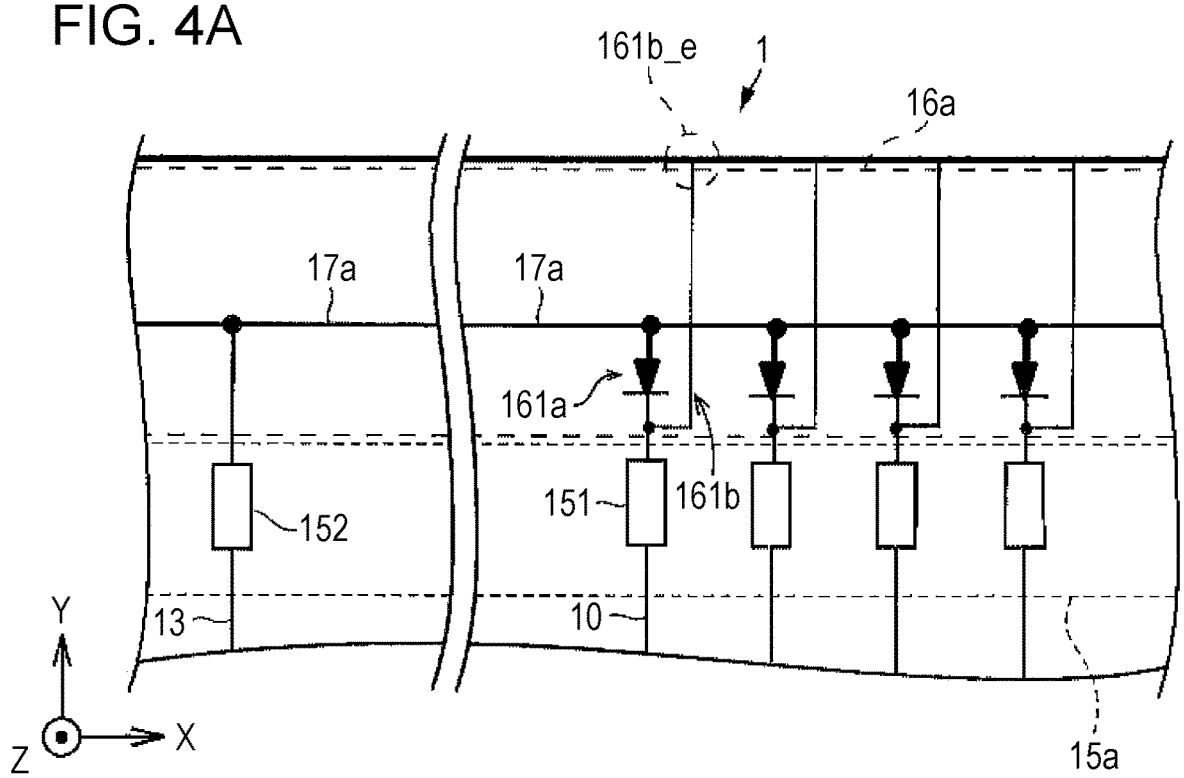
FIG. 4A schematically illustrates the terminal region in FIG. 1 and a portion of protective circuit region.
Figure 4B:
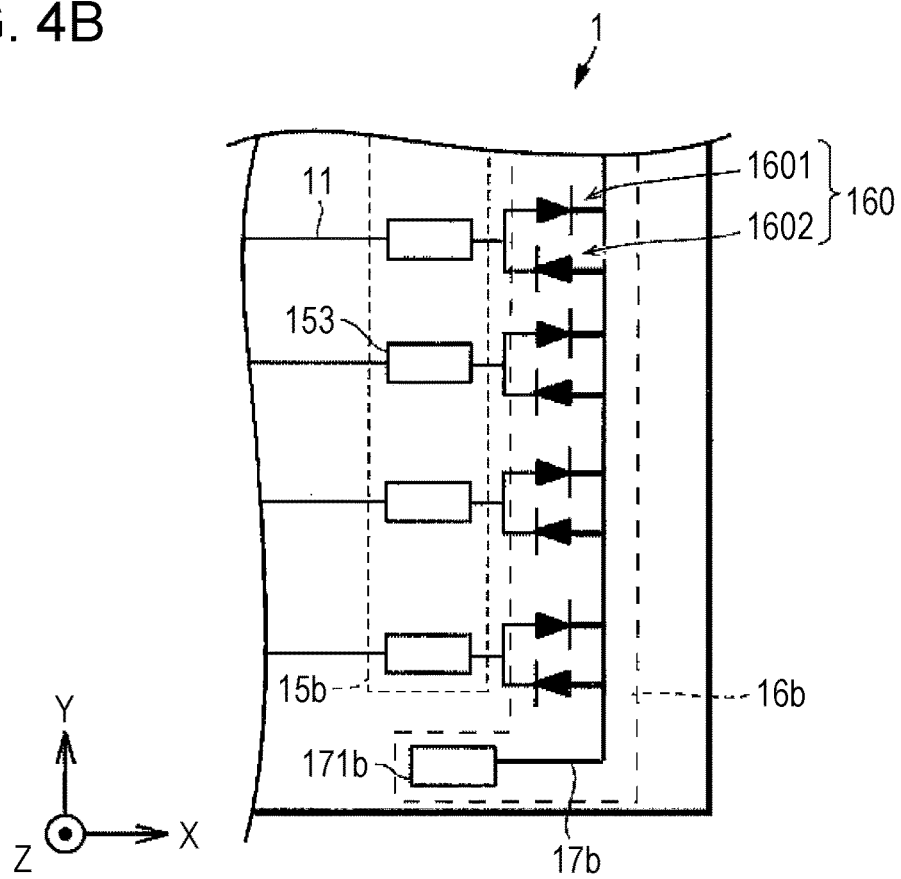
FIG. 4B schematically illustrates the terminal region different from that in in FIG. 4A and a portion of protective circuit region.

FIG. 4A is a plan view illustrating a portion of each of the terminal region 15a and the protective circuit region 16a, FIG. 4B is a plan view illustrating a portion of each of the terminal region 15b and the protective circuit region 16b.

Referring to FIG. 4A, the protective circuit region 16a includes per the data terminal 151 a protective circuit including multiple non-linear elements 161a, multiple first protective wirings 161b, and a common wiring 17a.

The non-linear element 161a may be a diode or a TFT. The anode of the non-linear element 161a is connected to the common wiring 17a and the cathode of the non-linear element 161a is connected to the corresponding data terminal 151.

The first protective wiring 161b is connected the junction between one data terminal 151 and the cathode of the non-linear element 161a corresponding to the data terminals 151. In this example, the first protective wiring 161b is made of the same material as that of the gate of the TFT 21. The first protective wiring 161b crosses the common wiring 17a with an insulating film (not illustrated) interposed therebetween and extends to the edge portion of the imaging panel 1. Specifically, an end portion 161b_e of the first protective wiring 161b not connected to the data terminal 151 and non-linear element 161a is exposed to the atmosphere.

Referring to FIG. 4A, the bias terminal 152 is connected between the bias wiring 13 and the common wiring 17a. The bias wiring 13 is supplied with a bias voltage that causes the photoelectric conversion element 22 to be reverse-biased.

During imaging, the bias wiring 13 is supplied a bias voltage (for example, −6 V) and the data line 10 is supplied with a data voltage (for example, 1 V). If the bias terminal 152 is supplied with the bias voltage, the common wiring 17a has the same voltage as the bias voltage. The non-linear element 161a is then reverse-biased. For this reason, if a negative static electricity is induced on the data line 10, the non-linear element 161a is forward-biased, causing the common wiring 17a to be electrically conductive with the data terminals 151. Since the negative static electricity induced on the data line 10 is canceled by a positive charge from the common wiring 17a, the data lines 10 may be less susceptible to static breakdown.

If a positive static electricity is induced on the data line 10, the non-linear element 161a is reverse-biased, causing the common wiring 17a to be electrically non-conductive with the data terminals 151. Without the first protective wiring 161b, the static electricity is difficult to drain and there is a possibility that the data line 10 is statically broken down. In accordance with the first embodiment, if an excessively high static electricity is induced regardless of being positive or negative, the static electricity drains through the first protective wiring 161b. The end portion 161b_e of the first protective wiring 161b is exposed to the atmosphere and a virtual capacitor is formed between the end portion 161b_e of the first protective wiring 161b and the atmosphere. Since the amount of charge of the static charge is relatively high, the charge having flown through the first protective wiring 161b is drained to the atmosphere through the end portion 161b_e of the first protective wiring 161b to some extent. If static electricity regardless of being positive or negative is induced on the data line 10, the data lines 10 are less susceptible to static breakdown than when the first protective wiring 161b is not employed.

During imaging, the charge into which the photoelectric conversion element 22 has converted scintillation light flows from the data line 10 to the first protective wiring 161b. Since the voltage applied to the data line 10 during imaging is lower than the static electricity, no charge is drained from the end portion 161b_e of the first protective wiring 161b to the atmosphere. In such a case, the first protective wiring 161b and the data line 10 are almost at the same voltage and the imaging results are rarely affected by the charge.

The protective circuit region 16b is described below. Referring to FIG. 4B, the protective circuit region 16b includes multiple protective circuits 160 per gate terminal 153, common wiring 17b, and ground (GND) terminal 171b.

The protective circuit 160 includes two non-linear elements (1601 and 1602), each being a diode or TFT. The non-linear element 1601 has an anode connected to a gate terminal 153 and a cathode connected to the common wiring 17b. The non-linear element 1602 has an anode connected to the common wiring 17b and a cathode connected to the gate terminal 153.

The common wiring 17b is connected to the ground (GND) terminal 171b. The GND terminal 171b is supplied with a predetermined reference voltage (for example, less than 1 V) from outside the imaging panel 1.

When the gate lines 11 are scanned, the gate lines 11 are supplied with, for example, +20 V as a scan voltage by the driving circuit (not illustrated). On the other hand, when the gate lines 11 are not scanned, the gate lines 11 are supplied with a voltage lower than the voltage at the common wiring 17b, for example, with a voltage as low as −10 V by the driving circuit (not illustrated).

During non-scanning period of the gate lines 11, the non-linear elements 1601 are reverse-biased and the non-linear elements 1602 are forward-biased. On the other hand, during scanning period of the gate lines 11, the non-linear elements 1601 are forward-biased and the non-linear elements 1602 are reverse-biased. Specifically, during each of the non-scanning period and the scanning period, one of the non-linear element 1601 and the non-linear element 1602 is forward-biased, causing the common wiring 17b to be electrically conductive with the gate line 11.

If a static electricity higher than the voltage of the common wiring 17b is induced on a gate line 11 during the non-scanning period of gate lines 11, the non-linear element 1601 connected to the gate line 11 is forward-biased and the non-linear element 1602 is reverse-biased. Since the other non-linear elements 1602 remain forward-biased, the static electricity is dissipated to the common wiring 17b and the other gate lines 11 and the gate line 11 is less susceptible to static breakdown. Even if a static electricity lower than the voltage of the common wiring 17b is induced on a gate line 11 during the non-scanning period of the gate lines 11, all the non-linear elements 1601 are reverse-biased and all the non-linear elements 1602 are forward-biased. A positive charge flows into the gate line 11 from the common wiring 17b via the non-linear element 1602, cancelling the static electricity induced on the gate line 11. The gate line 11 may be less susceptible to static breakdown.

In accordance with the first embodiment, the bias terminal 152 is connected to the common wiring 17a. In place of the bias terminal 152, a ground (GND) terminal having the same reference voltage as the GND terminal 171 may be connected to the common wiring 17a. In this configuration, the non-linear element 161a is reverse-biased with the data line 10 supplied with a data voltage (as high as about 1 V). If a negative static electricity is induced on the data line 10, the non-linear element 161a is forward-biased. A positive charge flows into the data line 10 from the common wiring 17a via the non-linear element 161a, cancelling static electricity. The data lines 10 may thus be less susceptible to static breakdown. If a positive static electricity is induced on the data line 10, the static electricity may be dissipated to the atmosphere via the first protective wiring 161b to some extent and the data line 10 may be less susceptible to static breakdown by the positive static electricity.

Second Embodiment

In accordance with the first embodiment, the bias terminal 152 is directly connected to the common wiring 17a and if static electricity is induced on the bias wiring 13, the bias wiring 13 may be statically broken down. A second embodiment is related to the configuration in which not only the data lines 10 and the gate lines 11 but also the bias wiring 13 may be less susceptible to static breakdown.

Figure 5:
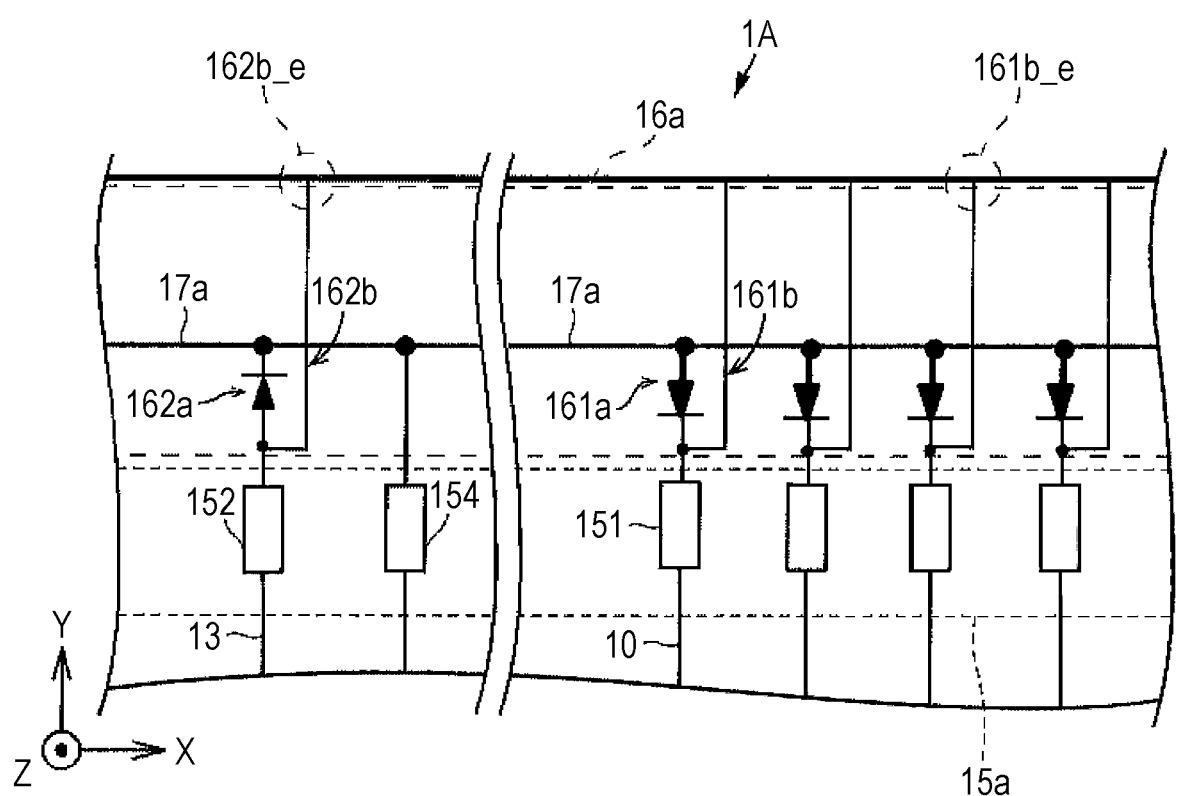
FIG. 5 is a plan view of a portion of an imaging panel according to a second embodiment, illustrating one of terminal regions and protective circuit region.

FIG. 5 is a plan view illustrating a configuration example of the terminal region 15a and the protective circuit region 16a in an imaging panel 1A of the second embodiment. Referring to FIG. 5, elements identical to those in the first embodiment are designated with the same reference numerals. The following discussion focuses on a difference between the first embodiment and the second embodiment.

Referring to FIG. 5, the terminal region 15a of the second embodiment includes a GND terminal 154 having a predetermined reference voltage like the GND terminal 171b described above. The GND terminal 154 is connected to the common wiring 17a.

The protective circuit region 16a includes, in addition to the non-linear elements 161a respectively arranged for the data lines 10, non-linear element 162a and second protective wiring 162b. The non-linear element 162a is connected between the bias terminal 152 and the common wiring 17a. Specifically, the anode of the non-linear element 162a is connected to the bias terminal 152 and the cathode of the non-linear element 162a is connected to the common wiring 17a.

Referring to FIG. 5, the second protective wiring 162b is connected to the junction of the bias terminal 152 and the non-linear element 162a. The second protective wiring 162b crosses the common wiring 17a with an insulating film (not illustrated) interposed therebetween and extends the edge portion of the imaging panel 1A. Specifically, an end portion. 162b_e of the second protective wiring 162b is exposed to the atmosphere in the same way as the end portion 161b_e of the first protective wiring 161b.

The common wiring 17a is biased at a reference voltage (less than 1 V) via the GND terminal 154. If a bias voltage as low as about −6V is applied to the bias terminal 152, the non-linear element 162a is reverse-biased. If a positive static electricity higher than the voltage of the common wiring 17a is induced on the bias wiring 13, the non-linear element 162a is forward-biased and the positive static electricity is drained to the common wiring 17a. If a negative static electricity is induced on the bias wiring 13, the static electricity flows to the second protective wiring 162b and is then dissipated to the atmosphere through the end portion 162b_e of the second protective wiring 162b to some extent. If a static electricity regardless of being positive or negative is induced on the data line 10, the data line 10 may be less susceptible to static breakdown.

In accordance with the second embodiment, the non-linear element 161a is reverse-biased when a data voltage (as high as about 1 V) is applied to the data line 10. If a negative static electricity is induced on the data line 10, the non-linear element 161a is forward-biased, a positive charge flows to the data line 10 from the common wiring 17a via the non-linear element 161a, cancelling the static electricity. If a positive static electricity is induced on the data line 10, the static electricity flows through the first protective wiring 161b and is dissipated to the atmosphere via the end portion 161b_e of the first protective wiring 161b to some extent. If a static electricity regardless of being positive or negative is induced on the data line 10, the data line 10 may be less susceptible to static breakdown.

Third Embodiment

In the second embodiment, if a positive static electricity is induced on the data line 10, the static electricity is dissipated to the atmosphere via the first protective wiring 161b connected to the data line 10 to some extent. Static breakdown is less likely to occur than without the first protective wiring 161b. Static breakdown is more desirably controlled on the data lines 10 against static electricity regardless of being positive or negative. A third embodiment is related to the configuration in which static breakdown is less likely to occur on the data lines 10 than in the second embodiment.

Figure 6:
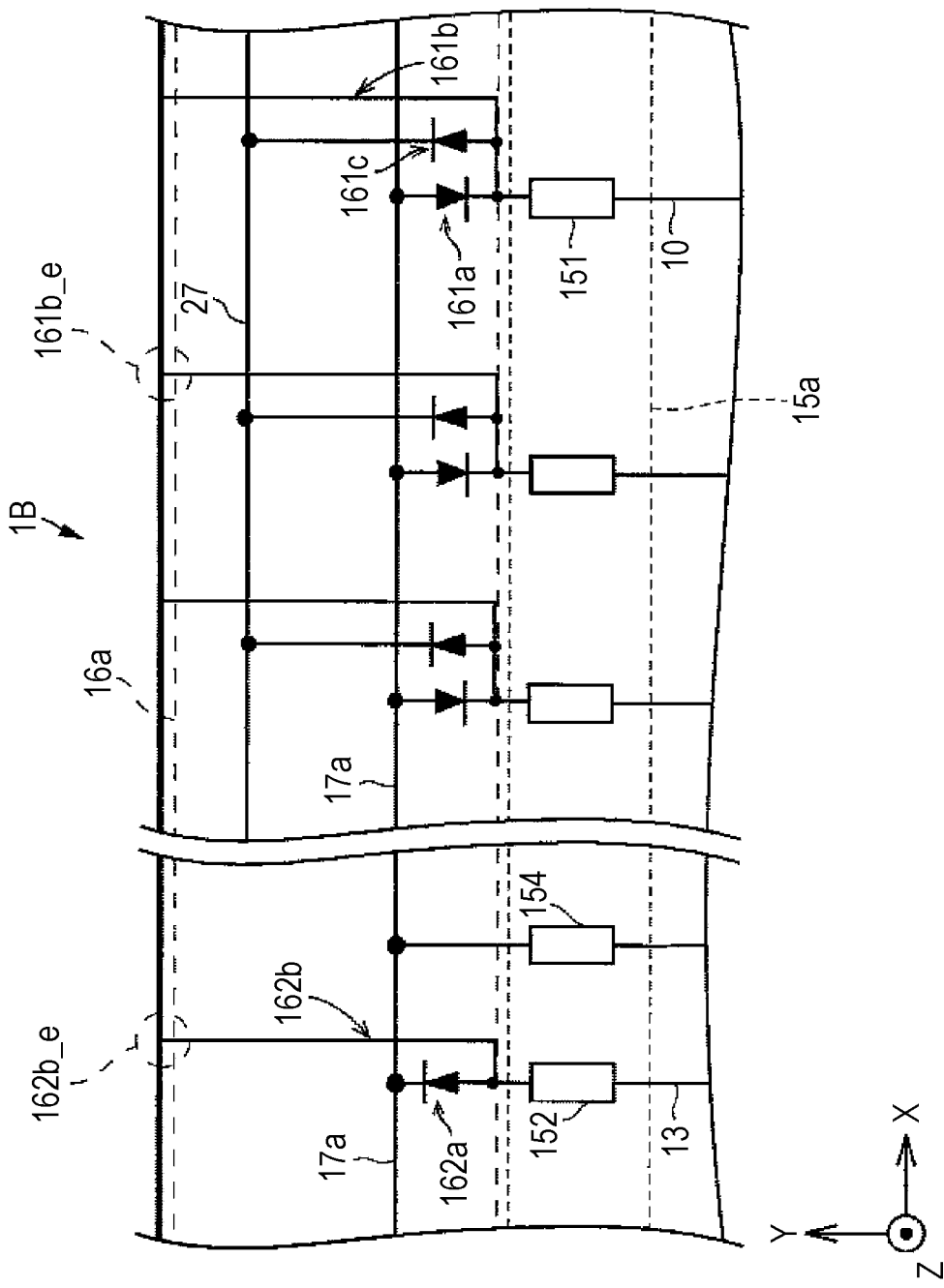
FIG. 6 is a plan view of a portion of an imaging panel according to a third embodiment, illustrating one of terminal regions and protective circuit region.

FIG. 6 is a plan view illustrating a portion of the configuration example of the terminal region 15a and the protective circuit region 16a in an imaging panel 1B of the third embodiment. Referring to FIG. 6, elements identical to those in the second embodiment are designated with the same reference numerals. The following discussion focuses on a difference between the second embodiment and the third embodiment.

Referring to FIG. 6, the protective circuit region 16a includes, in addition to the non-linear elements 161a, common wiring 17a, and first protective wirings 161b, a non-linear elements 161c for each of the data terminals 151, and a common wiring 27.

Like the non-linear element 161a, the non-linear element 161c is a diode or the like. The non-linear element 161c is connected between the common wiring 27 and each of the data terminals 151. Specifically, the anode of the non-linear element 161c is connected to the data terminal 151 and the cathode of the non-linear element 161c is connected to the common wiring 27. The non-linear element 161c with the data voltage applied is reverse-biased.

The common wiring 27 is connected to a terminal (not illustrated) having a voltage higher than the data voltage by about 1 V.

If a positive static electricity higher than the voltage of the common wiring 27 is induced on the data line 10, the static electricity flows via the first protective wiring 161b in the same way as described in the second embodiment. The charge of static electricity is thus dissipated to the atmosphere via an end portion 1661b_e of the first protective wiring 161b to some extent. In accordance with the third embodiment, the non-linear element 161c is then forward-biased and the static electricity is also drained to the common wiring 27. If a positive static electricity is induced on the data line 10, the data line 10 is less susceptible to static breakdown than in the second embodiment.

Fourth Embodiment

An imaging panel substrate assembly 100 of a fourth embodiment in the manufacturing process of the imaging panels of the first through third embodiments is described below.

Figure 7:
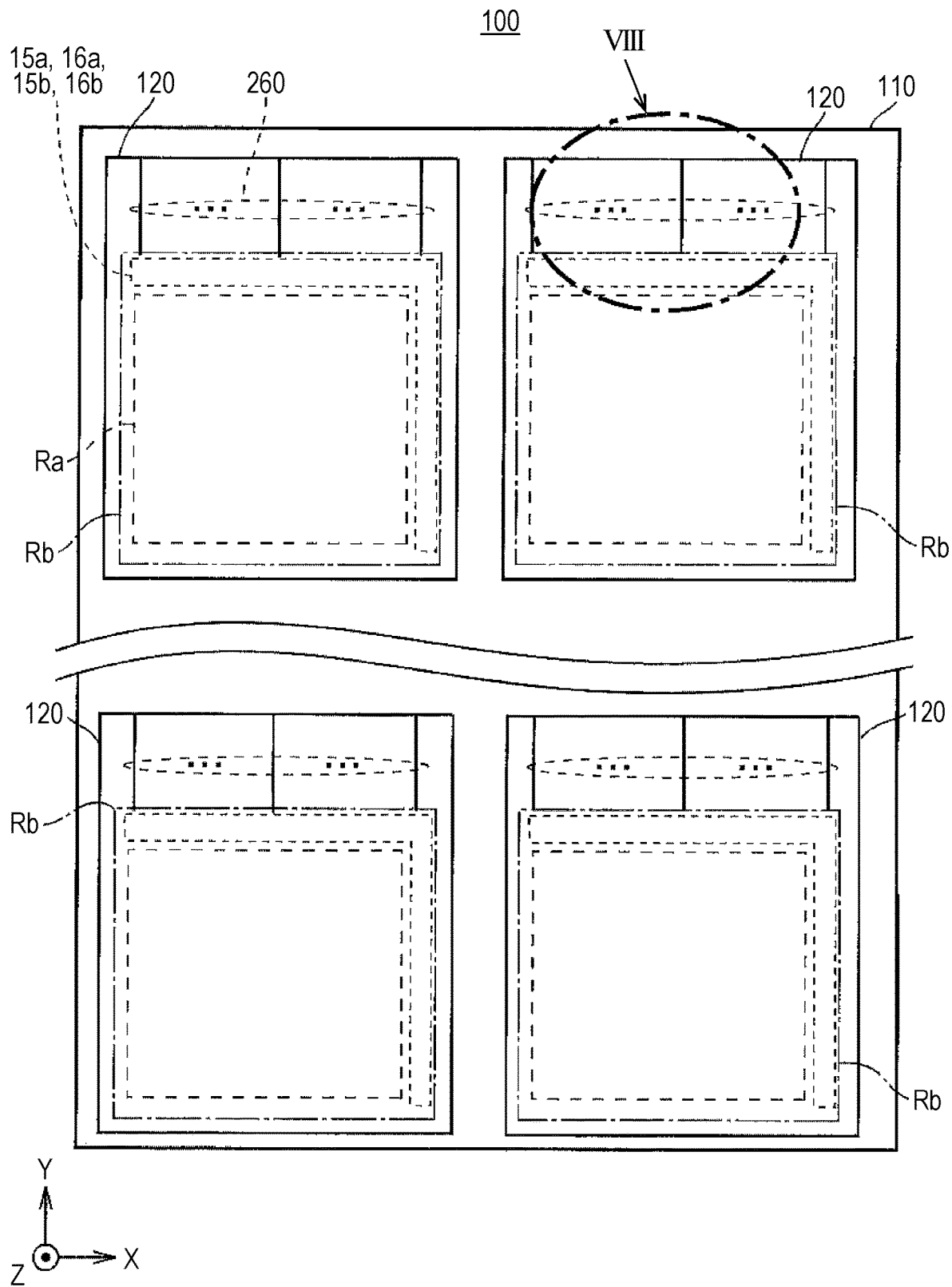
FIG. 7 is a plan view schematically illustrating San imaging panel substrate assembly of a fourth embodiment.

FIG. 7 is a plan view schematically illustrating the imaging panel substrate assembly 100 of the fourth embodiment. Referring to FIG. 7, the imaging panel substrate assembly 100 includes, on a substrate 110, multiple imaging panel regions Rb, a static protective wiring 120, and multiple first protective wirings 260.

The imaging panel region Rb includes the imaging region Ra identical to the imaging region Ra in each of the imaging panels 1, 1A, and 1B, terminal regions 15a and 15b, and protective circuit regions 16a and 16b. Each of the imaging panels 1, 1A, and 1B is formed each time a single imaging panel region Rb on the substrate 110 is cut. In other words, FIG. 7 schematically illustrates the imaging panel substrate assembly before the imaging panels are formed.

Referring to FIG. 7, four imaging panel regions Rb are formed on the imaging panel substrate assembly 100. It may be sufficient if at least one imaging panel region Rb is formed on the imaging panel substrate assembly 100.

The static protective wiring 120 is outside the imaging panel region Rb and surrounds the periphery of the imaging panel region Rb. The static protective wiring 120 is connected with each imaging panel region Rb via multiple first protective wirings 260.

Figure 8:
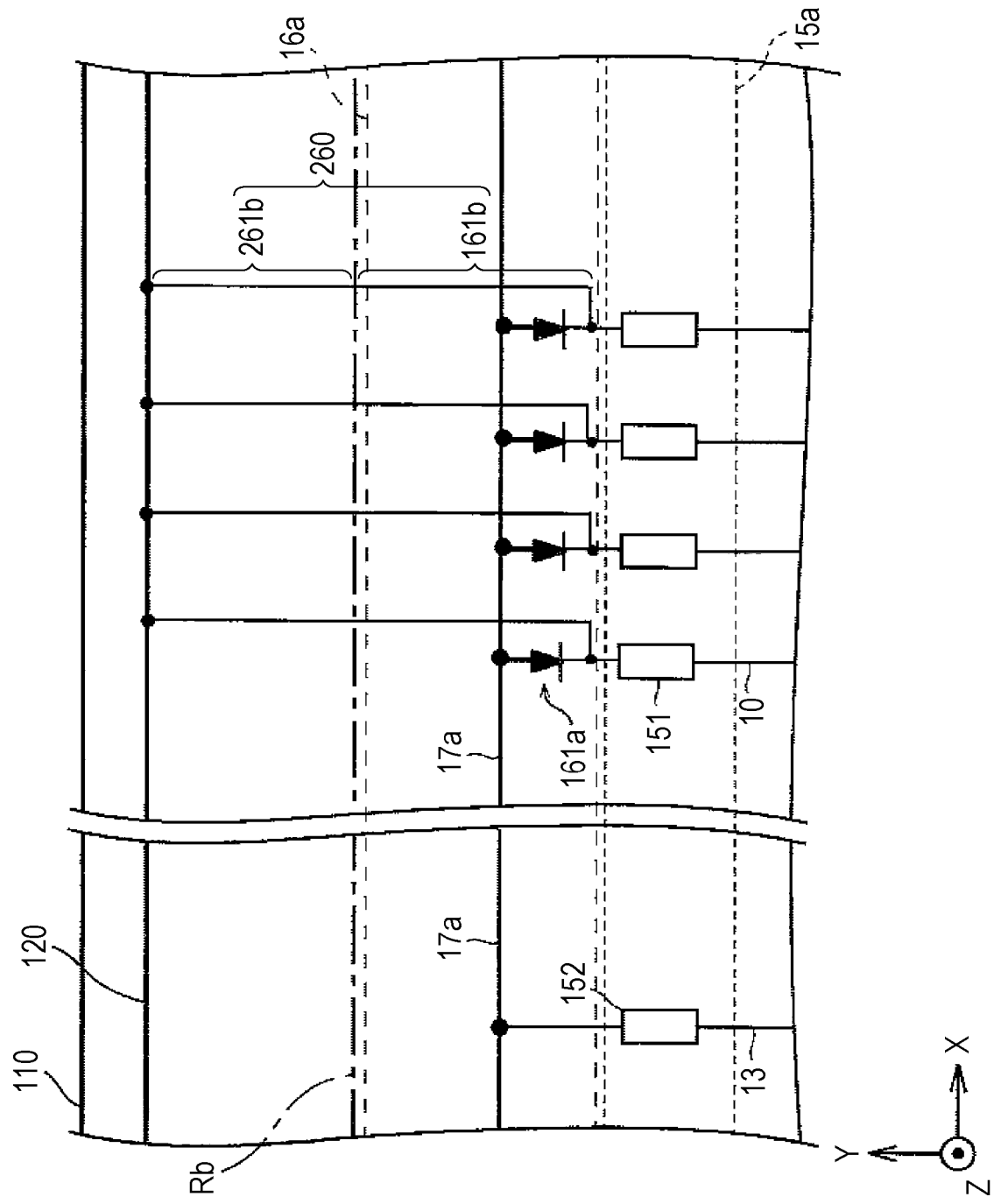
FIG. 8 is a plan view schematically illustrating in enlargement, a dot-dash line portion VIII in FIG. 7.

FIG. 8 illustrates in enlargement a dot-dash line portion VIII in FIG. 7. Referring to FIG. 8, the first protective wiring 260 includes the first protective wiring 161b within the imaging panel region Rb and a portion 261b (hereinafter referred to as partial wiring 261b) which is an extension of the first protective wiring 161b outside the imaging panel region Rb. Before cutting the imaging panel region Rb, consecutively arranged first protective wirings 260 connect the static protective wiring 120 to the data terminals 151.

When the imaging panel region Rb is cut, the first protective wirings 161b cut away from the partial wirings 261b of the first protective wirings 260 remain on each of the imaging panels 1, 1A, and 1B.

FIG. 8 illustrates the imaging panel region Rb of the imaging panel 1. The imaging panel region Rb in the imaging panel 1A or 1B may be used instead of the imaging panel region Rb in the imaging panel 1.

Before the imaging panel region Rb is cut, namely, in the manufacturing process of the imaging panel, the bias terminal 152 is not supplied with the bias voltage and the data line 10 is not supplied with the data voltage. In such a condition, the non-linear element 161a is not in a fixed state, in other words, neither forward-biased nor reverse-biased. The first protective wiring 260 is connected to the data lines 10 in the fourth embodiment. If static electricity regardless of being positive or negative is induced on the data line 10, the static electricity is drained to the static protective wiring 120 via the first protective wiring 260.

When static electricity is induced on the static protective wiring 120, a charge of the static protective wiring 120 may flow into the first protective wiring 260. Since the first protective wirings 260 are connected to the static protective wiring 120, the charge of the static protective wiring 120 may be dissipated among the first protective wirings 260. The flow of charge of static electricity from the static protective wiring 120 does not concentrate on a single data line 10 via a single first protective wiring 260. Even if static electricity regardless of being positive or negative is induced on the data line 10, the data line 10 may be less susceptible to static breakdown.

Fifth Embodiment

In accordance with the fourth embodiment, static electricity induced on the static protective wiring 120 flows into the data line 10 to some extent from the static protective wiring 120 to the data line 10 via the first protective wiring 260. A fifth embodiment described below is related to the configuration in which static electricity induced on the static protective wiring 120 is less likely to flow in to the data line 10.

Figure 9:
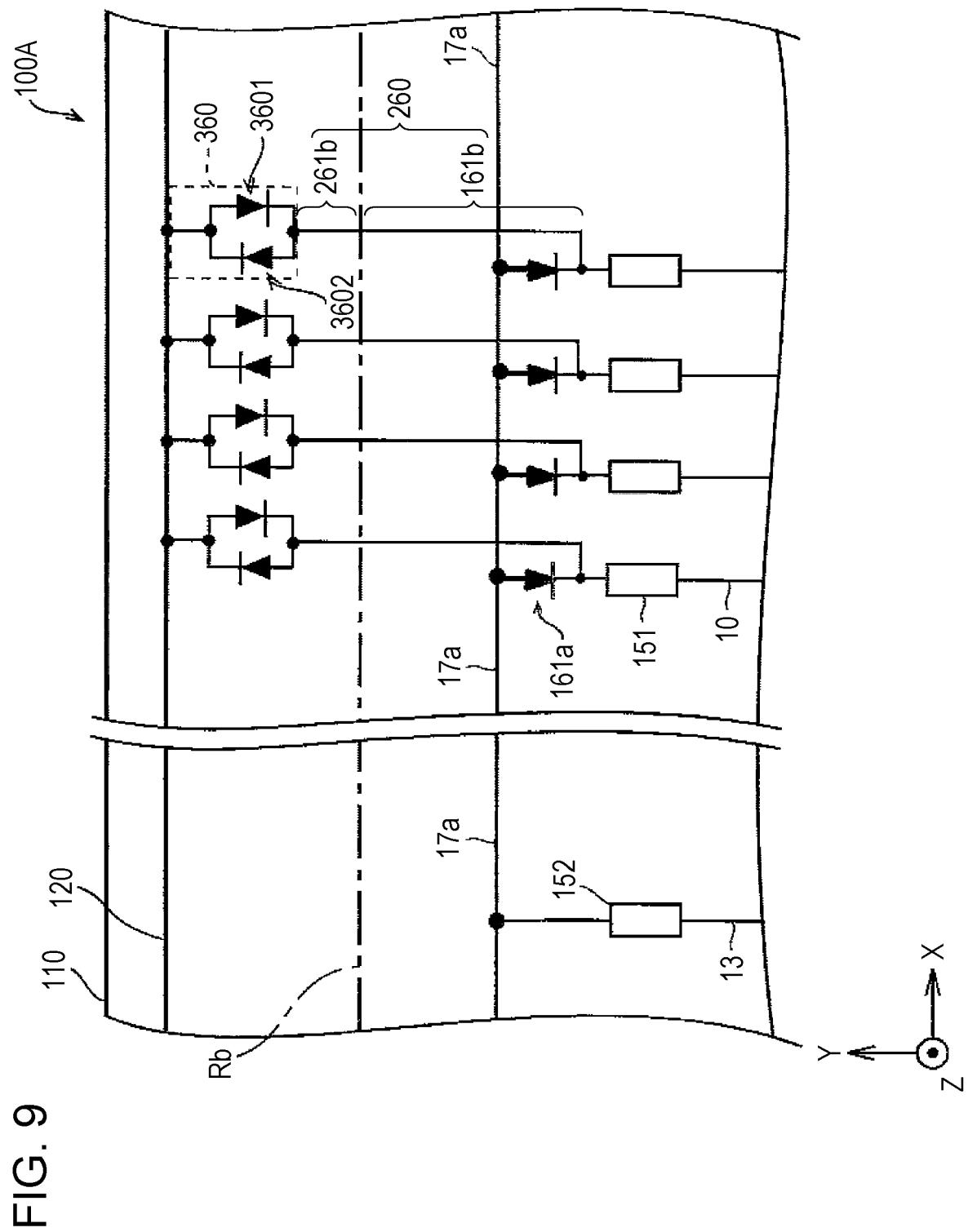
FIG. 9 is a plan view illustrating a portion of an imaging panel substrate assembly of a fifth embodiment.

FIG. 9 is a plan view schematically illustrating in enlargement a portion of the imaging panel substrate assembly 100 of the fifth embodiment. Referring to FIG. 9, elements identical to those in the fourth embodiment are designated with the same reference numerals. The following discussion focuses a difference between the fourth embodiment and the fifth embodiment.

Referring to FIG. 9, the imaging panel substrate assembly 100A includes a protective circuit 360 between the static protective wiring 120 and each of the first protective wirings 260. The protective circuit 360 includes two non-linear elements 3601 and 3602, each being a diode or the like.

The cathode of the non-linear element 3601 and the anode of the non-linear element 3602 are connected to the first protective wiring 260 and the anode of the non-linear element 3601 and the cathode of the non-linear element 3602 are connected to the static protective wiring 120. In other words, the forward direction of the non-linear element 3601 and the forward direction of the non-linear element 3602 are arranged side by side in mutually opposite directions between the static protective wiring 120 and the first protective wiring 260.

If a positive static electricity higher than the voltage of the static protective wiring 120 is induced on the data line 10, the non-linear element 3601 is reverse-biased while the non-linear element 3602 is forward-biased. The positive static electricity flows to the static protective wiring 120 via the non-linear element 3602. If the static protective wiring 120 becomes higher later in voltage than the first protective wiring 260, the non-linear element 3601 becomes forward-biased. Charge flows from the static protective wiring 120 into each first protective wiring 260 via each non-linear element 3601 from the static protective wiring 120. Charge flowing from the static protective wiring 120 into the data line 10 is reduced more than without the protective circuit 360. If a negative static electricity lower than the voltage of the static protective wiring 120 is induced on the data line 10, the non-linear element 3601 is forward-biased while the non-linear element 3602 is reverse-biased. A positive static electricity flows from the static protective wiring 120 into the first protective wiring 260, cancelling the negative static electricity.

Figure 10:
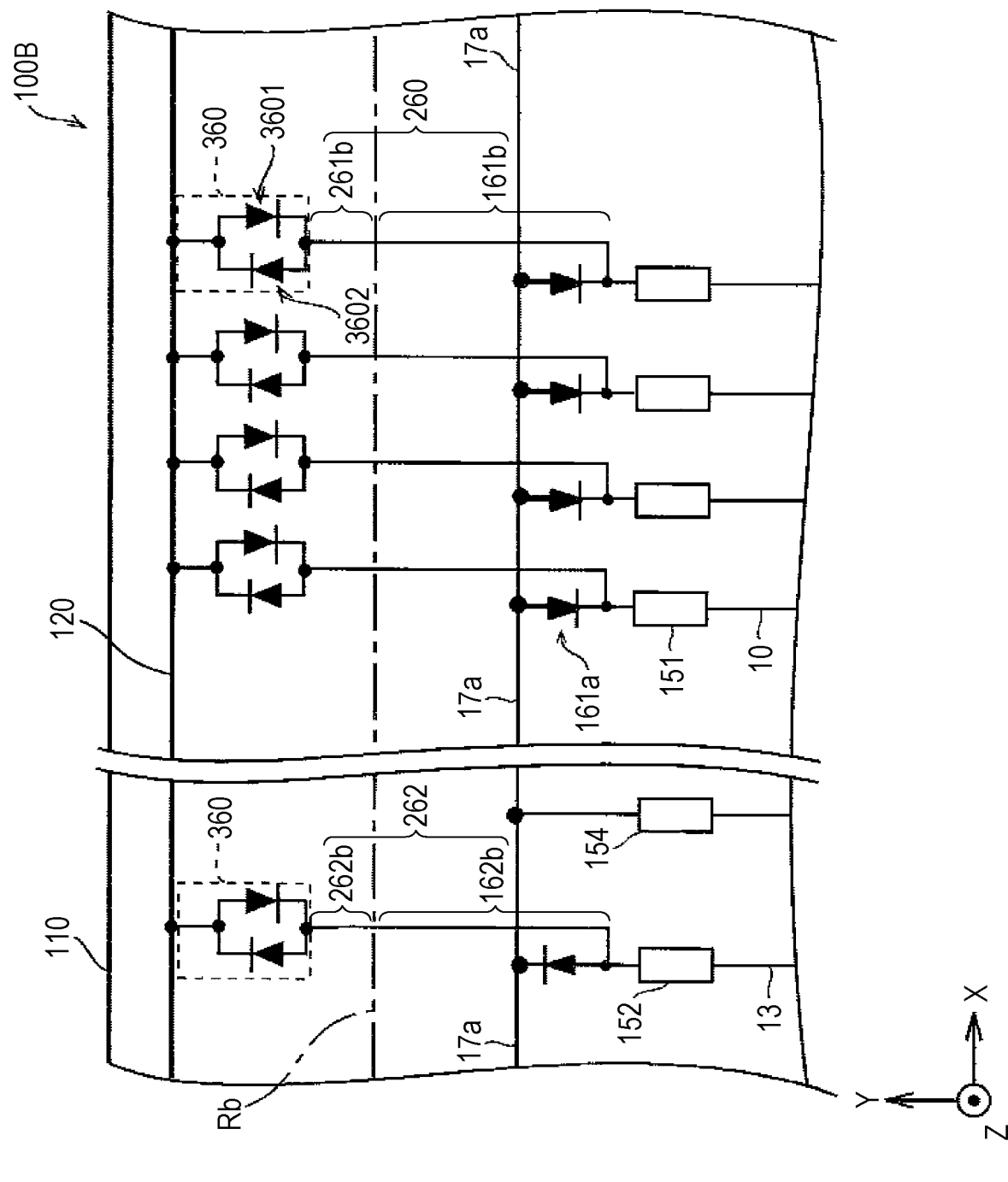
FIG. 10 is a plan view illustrating a configuration in which the structure of the imaging panel region of the second embodiment is applied to the imaging panel substrate assembly of the fifth embodiment.

Referring to FIG. 9, the imaging panel region Rb corresponding to the imaging panel 1 has been described. An imaging panel region in the imaging panel 1A or 1B may be used as the imaging panel region Rb formed in the imaging panel substrate assembly 100A. FIG. 10 is a plan view illustrating a portion of an imaging panel substrate assembly 110B in which the configuration of the imaging panel region Rb of the imaging panel 1A is applied to the imaging panel region Rb in FIG. 9. Referring to FIG. 10, the imaging panel substrate assembly 110B includes a second protective wiring 262 and the protective circuit 360 connected between the second protective wiring 262 and the static protective wiring 120.

The second protective wiring 262 includes the second protective wiring 162b and a partial wiring 262b that is an extension of the second protective wiring 162b. Before the imaging panel region Rb is cut, one second protective wiring 262 connects the bias terminal 152 to the protective circuit 360. In this configuration, if static electricity is induced on the bias wiring 13, the static electricity is drained via the second protective wiring 262 to the static protective wiring 120 or to the common wiring 17a depending on the polarity of static electricity. Depending on the voltage of the first protective wiring 260 or the voltage of the second protective wiring 262 with respect to the static protective wiring 120, the charge of static electricity flowing to the static protective wiring 120 is dissipated to the first protective wiring 260 and the second protective wiring 262. The amount of charge flowing from the static protective wiring 120 to the data line 10 and the bias wiring 13 may thus be reduced.

Sixth Embodiment

A sixth embodiment described below is related to the configuration in which an amount of charge flowing from the static protective wiring 120 to the data line 10 is reduced more than in the fifth embodiment.

Figure 11:
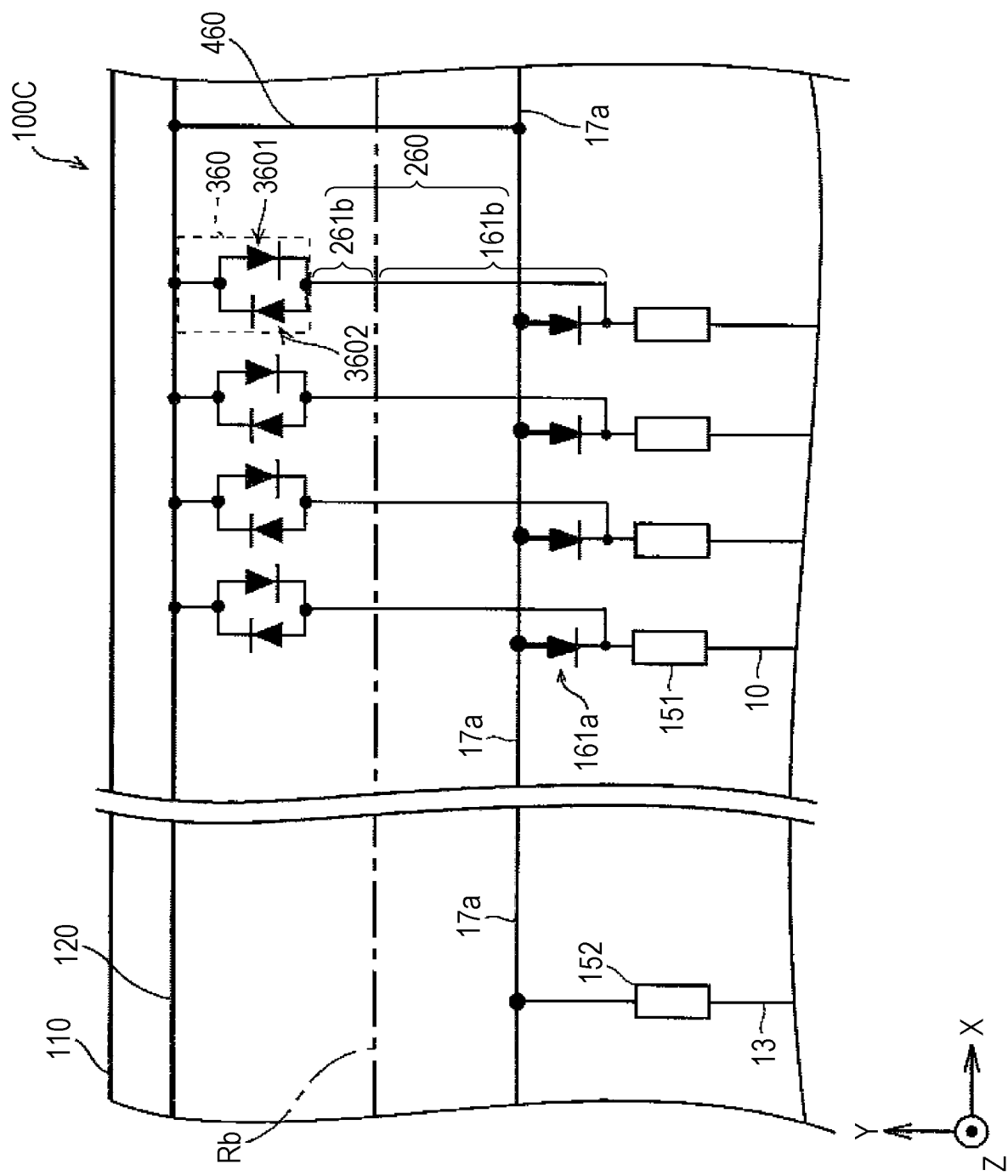
FIG. 11 is a plan view illustrating a portion of an imaging panel substrate assembly of a sixth embodiment.

FIG. 11 illustrates in enlargement a portion of the imaging panel substrate assembly 100C of the sixth embodiment. Referring to FIG. 11, elements identical to those in the fifth embodiment (FIG. 9) are designated with the same reference numerals. The following discussion focuses on a difference between the fifth embodiment and the sixth embodiment.

Referring to FIG. 11, the imaging panel substrate assembly 100C includes a wiring (hereinafter referred to as a relay wiring) 460 that connects the static protective wiring 120 to the common wiring 17a.

With the relay wiring 460, the charge of static electricity having flown through the static protective wiring 120 flows, to the common wiring 17a via the relay wiring 460. When each non-linear element 161*a* becomes forward biased in response to the voltages of the common wiring 17*a* and the data line 10, the charge having flown from the static protective wiring 120 to the common wiring 17*a* is distributed among the data lines 10 via the non-linear elements 161*a*. The amount of charge responsive to static electricity flowing from the static protective wiring 120 into the data line 10 may be reduced.

Referring to FIG. 11, the imaging panel region Rb in the imaging panel substrate assembly 1000 is the imaging panel region Rb in the imaging panel 1. The imaging panel substrate assembly corresponding to the imaging panel 1A or 1B may be employed. In such a case as well, the charge responsive to static electricity from the static protective wiring 120 is distributed by forming the relay wiring 460 between the static protective wiring 120 and the common wiring 17*a*. The amount of charge flowing into the bias wiring 13 and the data line 10 may thus be reduced.

Seventh Embodiment

Figure 12:
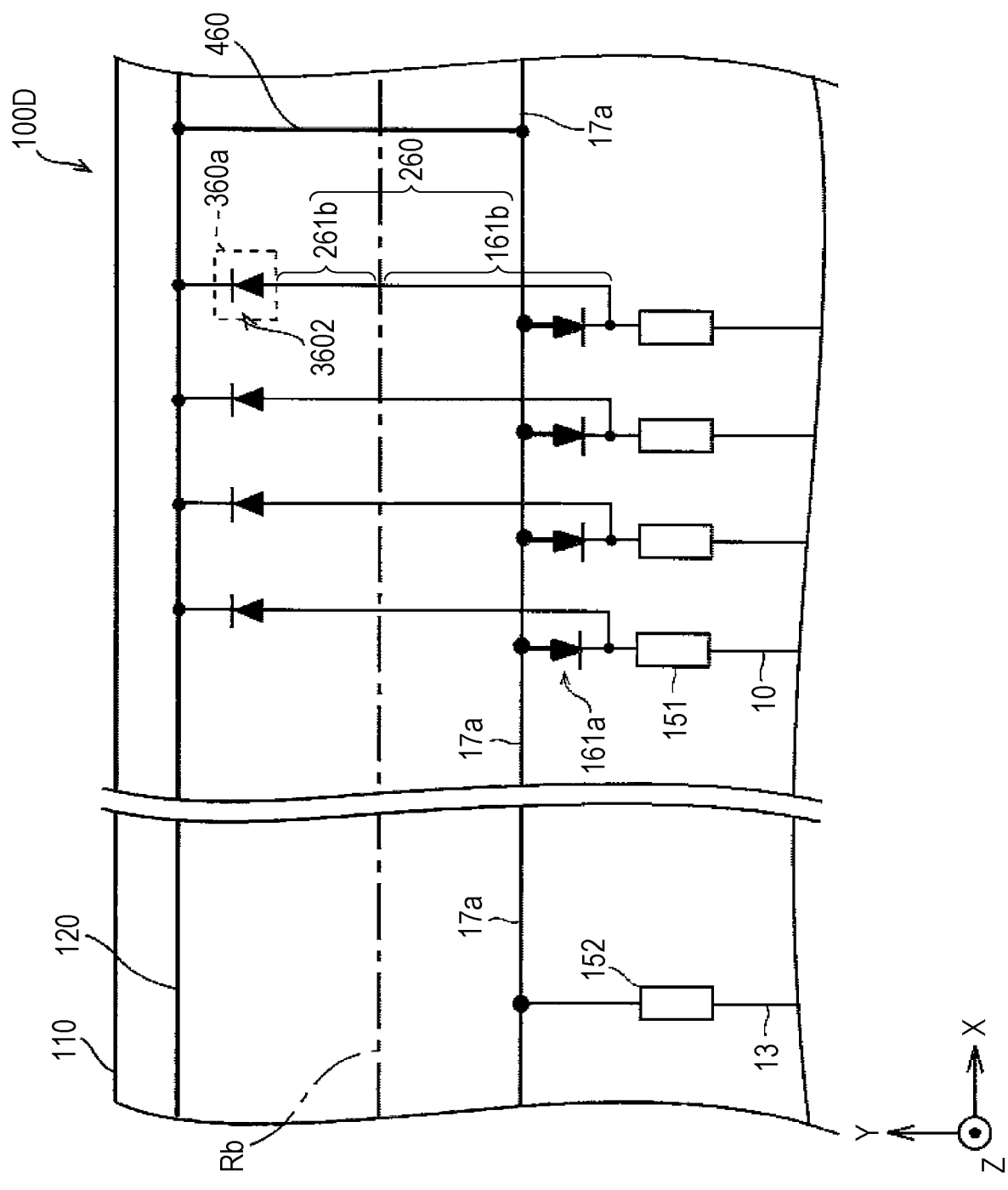
FIG. 12 is a plan view illustrating a portion of an imaging panel substrate assembly of a seventh embodiment.

In accordance with the sixth embodiment, the protective circuit 360 of the sixth embodiment includes the non-linear elements 3601 and 3602. The protective circuit 360 may possibly include only the non-linear element 3602. FIG. 12 schematically illustrates in enlargement a portion of an imaging panel substrate assembly 100D with the protective circuit 360 including only the non-linear element 3602. Referring to FIG. 12, elements identical to those in the sixth embodiment (FIG. 11) are designated with the same reference numerals.

Referring to FIG. 12, the imaging panel substrate assembly 100D includes the non-linear element 3602 as the protective circuit 360*a*. If a positive static electricity higher in voltage than the static protective wiring 120 is induced on the data line 10, the non-linear element 3602 is forward-biased, causing the static electricity to drain to the static protective wiring 120. If a negative static electricity lower in voltage than the common wiring 17*a* is induced on the data line 10, the non-linear element 161*a* becomes reverse-biased, and the charge from the common wiring 17*a* cancels the static electricity. If static electricity regardless of being positive or negative is induced on the data line 10, the data line 10 may be less susceptible to static breakdown.

Referring to FIG. 12, each protective circuit 360*a* in the imaging panel region Rb includes a single non-linear element 3602. The protective circuit 360*a* is smaller in circuit scale than the protective circuit 360 including two non-linear elements as illustrated in FIG. 11 and the number of imaging panels formed from one imaging panel substrate assembly is thus increased.

Referring to FIG. 12, the imaging panel region Rb in the imaging panel substrate assembly 100D is the imaging panel region Rb in the imaging panel 1. The imaging panel substrate assembly corresponding to the imaging panel 1A or 1B may be employed. In such a case as well, static breakdown of the bias wiring 13 and/or the data line 10 may be controlled by forming the protective circuit 360*a* between the first protective wiring 260 and/or the second protective wiring 262 and the static protective wiring 120.

Eighth Embodiment

The manufacturing process of the imaging panel substrate assembly described above is described as an eighth embodiment. In the following discussion, the imaging panel substrate assembly 110 (see FIG. 8) of the fourth embodiment is described below.

Figure 13A:
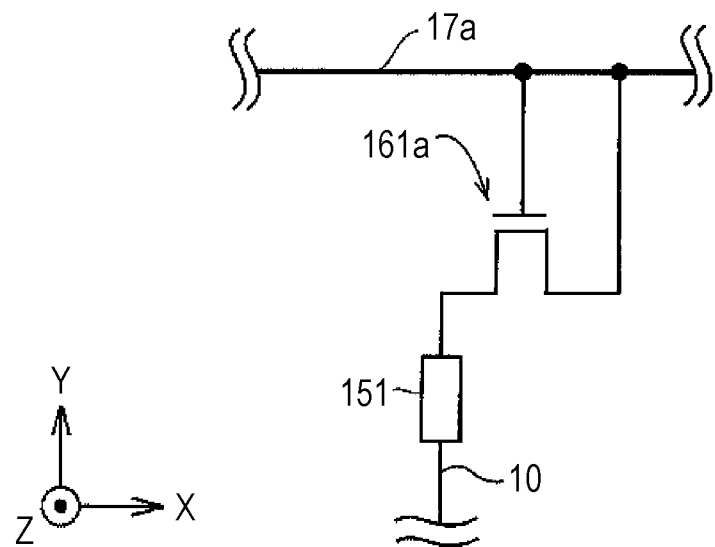
FIG. 13A is an equivalent circuit diagram of an eighth embodiment wherein a non-linear element connected to a data line includes a thin-film transistor (TFT)
Figure 13B:
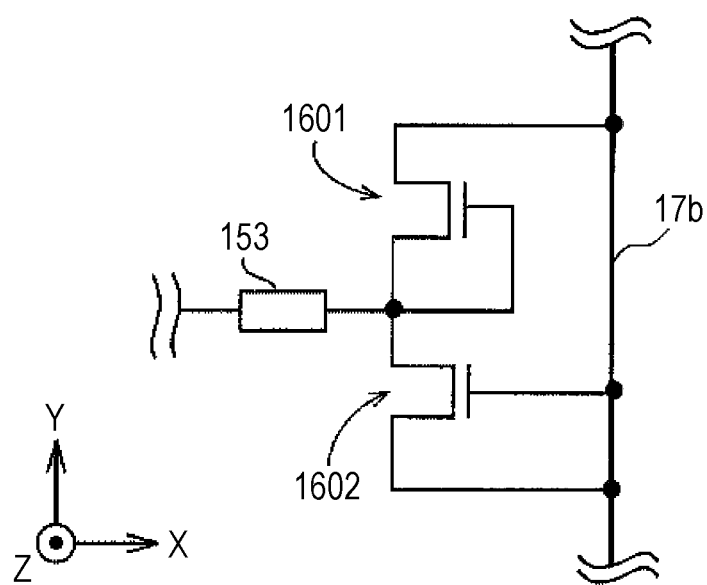
FIG. 13B is an equivalent circuit diagram of the eighth embodiment wherein the non-linear element connected to a gate line includes the TFT.

In accordance with the eighth embodiment, the non-linear elements 161*a*, 1601, and 1602 in the imaging panel substrate assembly 110 may be n-channel TFTs. In such a case, referring to FIG. 13A, the gate and drain of the TFT 161*a* are connected to the common wiring 17*a* and the source of the TFT 161*a* connected to the data terminal 151. Referring to FIG. 13B, the gate and drain of the TFT 1601 are connected to the gate terminal 153 and the source of the TFT 1601 is connected to the common wiring 17*b*. The gate and drain of the TFT 1602 are connected to the common wiring 17*b* and the source of the TFT 1602 is connected to the gate terminal 153.

The non-linear elements 161*a*, 1601, and 1602 are made of the same material as that of the TFT 21 (see FIG. 2) mounted on the pixel P and are manufactured in the manufacturing process of the TFT 21. The manufacturing process of the TFT 21 is representatively described and the manufacturing process of the non-linear elements 161*a*, 1601, and 1602 is not described herein.

FIGS. 14A through 14L are schematic sectional views illustrating the manufacturing process of a region (hereinafter referred to as region A1) where the TFT 21 and the photoelectric conversion element 22 are arranged in a pixel P in the imaging region Ra and the manufacturing process of a region (hereinafter referred to as region A2) where the common wiring 17*a* crosses the first protective wiring 260 (161*b*) in the imaging panel region Rb.

A metal film of tantalum nitride (TaN) and a metal film of tungsten (W) are formed in this order on the substrate 110, for example, through the sputtering process. The metal films laminated are patterned through the photolithography and dry etching processes (see FIG. 14A). In this way, the gate 21*a* of the TFT 21 is formed in the region A10 and the first protective wiring 260 is formed in the region. A2.

In order to cover the gate 21*a* and the first protective wiring 260, a silicon nitride (SiNx) film and silicon oxide (SiO$_2$) film are formed in this order as inorganic insulating films on the imaging panel substrate assembly 110 on the imaging panel module 110 through the chemical vapor deposition (CVD) process (see FIG. 14B). In this way, gate insulating film 111 is formed covering a gate 21*a* in the region A1 and the first protective wiring 260 in the region A2.

An oxide semiconductor layer containing indium (In), gallium (Ga), zinc (Zn), and oxygen (O$_2$) at their respective ratios is formed on the gate insulating film 111, for example, through the sputtering process. The oxide semiconductor layer is patterned through the photolithography and dry etching processes (see FIG. 14C). In this way, a semiconductor layer 21*b* that overlaps the gate electrode 21*a* in plan view is formed in the region A1.

Figure 14D:
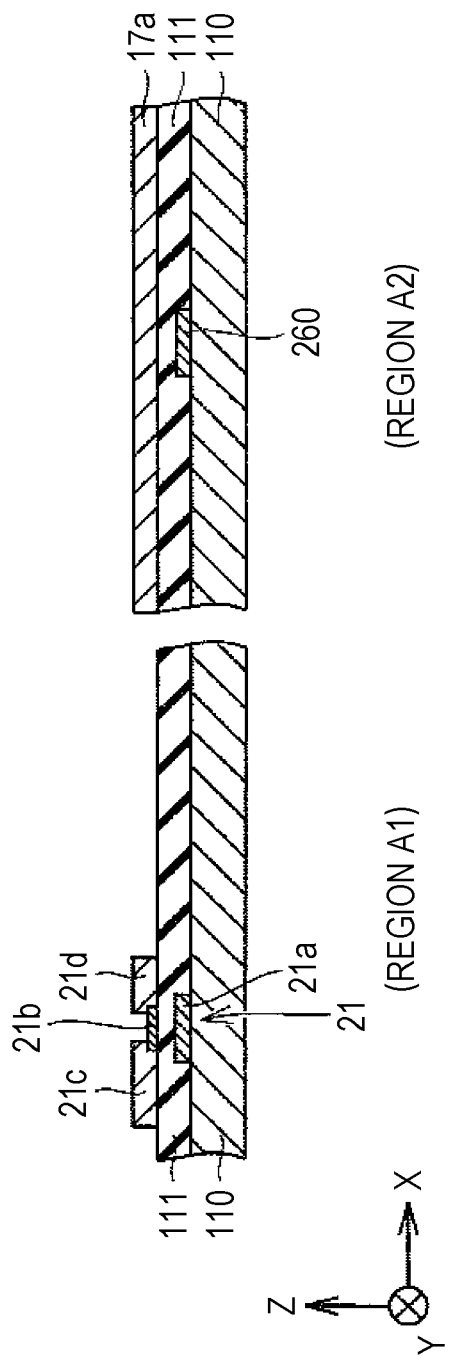
FIG. 14D is a sectional view illustrating the substrate in FIG. 14C on which a source and drain are formed in the region A10 and a common wiring is formed in the region A2.
Figure 14E:
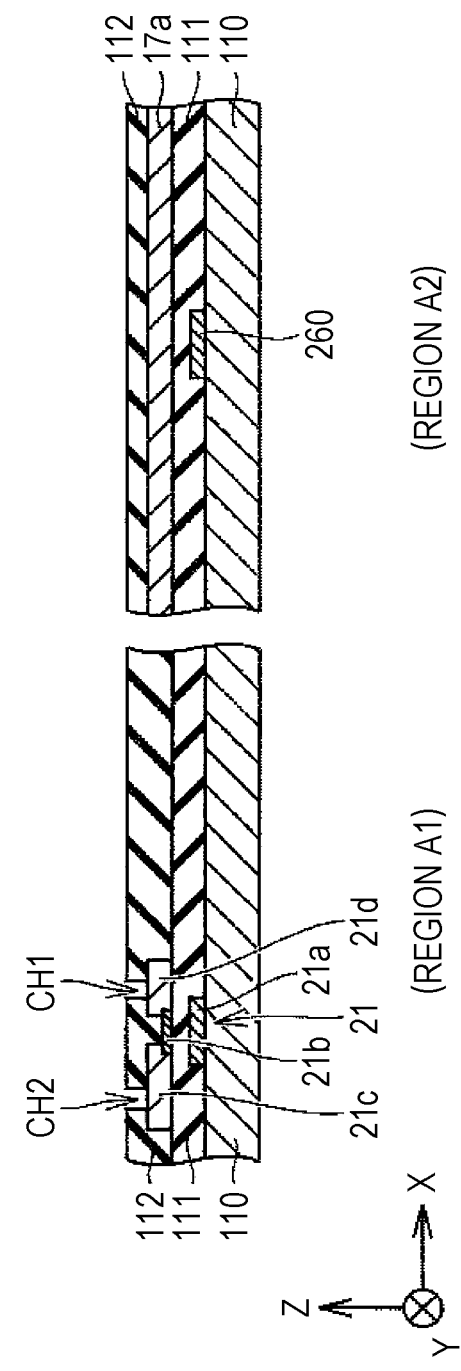
FIG. 14E is a sectional view illustrating the substrate in FIG. 14D on which inorganic insulating films are formed in the regions A1 and A2.

Metal films of titanium (Ti), aluminum (Al), and titanium (Ti) are laminated in this order, for example, through the sputtering process and the laminated metal films are then patterned through the photolithography and dry etching processes (see FIG. 14D). A source 21*c* and drain 21*d* separated from each other are thus formed on the semiconductor layer 21*b* in the region A1. The TFT 21 is thus formed. The common wiring 17*a* is formed on the gate insulating film 111 in the region A2. The static protective wiring 120 (see FIG. 8) made of the same material as that of the common wiring 17*a* is also formed when the common wiring 17*a* is formed, although the formation process of the static protective wiring 120 is not illustrated.

A silicon oxide (SiO$_2$) film as an inorganic insulating film is formed through the CVD process. The inorganic insulating film is then patterned through the photolithography and dry etching processes (see FIG. 14E). An inorganic insulating film 112 having contact holes CH1 and CH2 at locations respectively overlapping a drain electrode 21d and source electrode 21c in plan view is thus formed in the region A1. The inorganic insulating film 112 is also formed on the common wiring 17a in in the region A2.

Figure 14F:
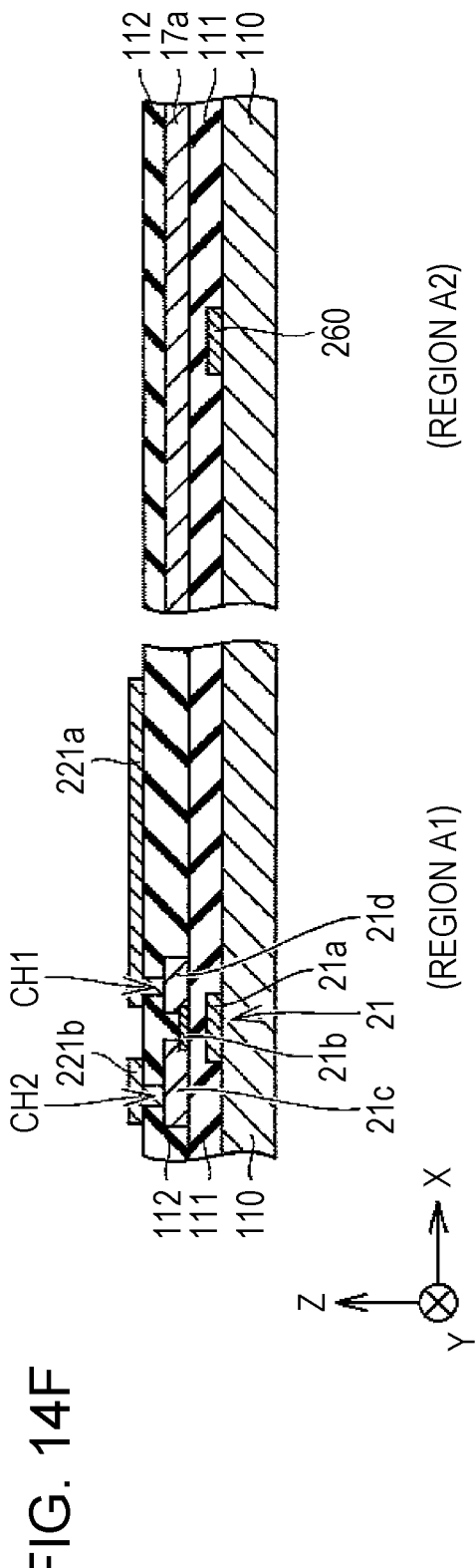
FIG. 14F is a sectional view illustrating the substrate FIG. 14E on which a lower electrode and a relay electrode are formed in the region A1.
Figure 14G:
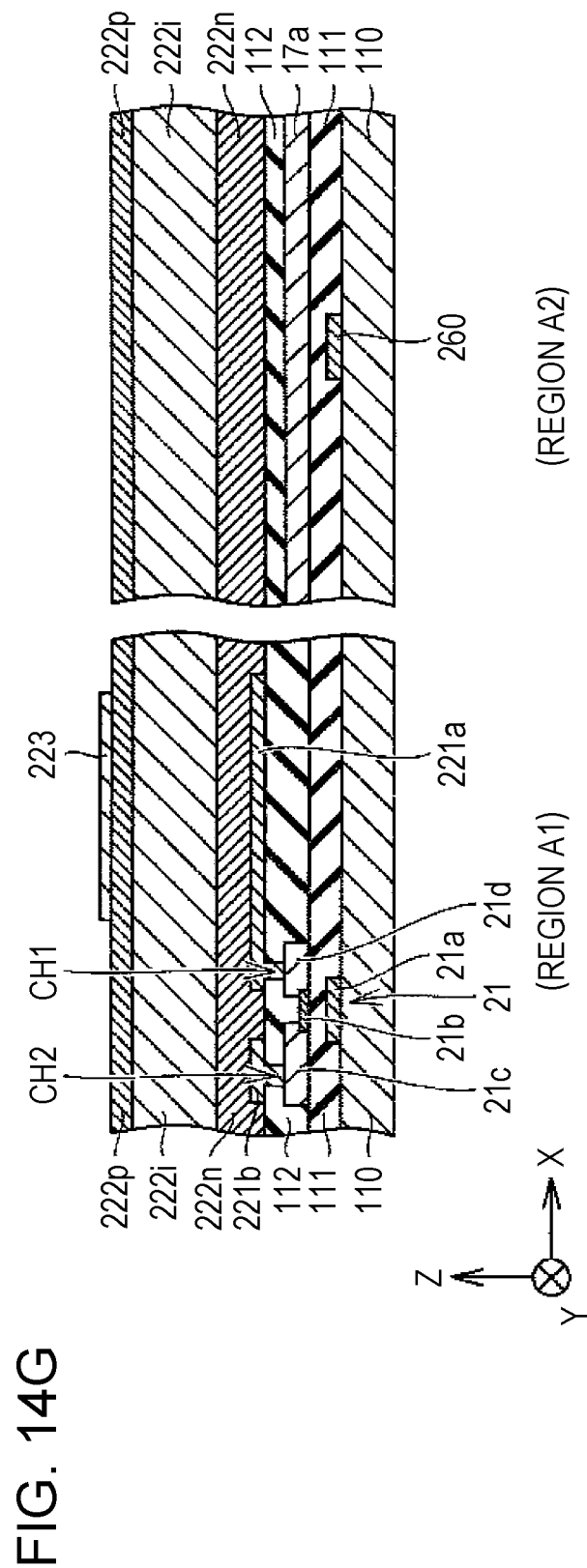
FIG. 14G is a sectional view illustrating the substrate in FIG. 14F on which a semiconductor layer and an upper electrode are formed in the region A1 and a semiconductor layer is formed in in the region A2.

Metal films of titanium (Ti), aluminum (Al), and titanium (Ti) are laminated in this order through the sputtering process and the laminated metal films are then patterned through the photolithography and dry etching processes (see FIG. 14F). In this way, a lower electrode 221a and a relay electrode 221b are formed on the inorganic insulating film 112 in the region A1. The lower electrode 221a is connected to the drain 21d via the contact hole CH1 and the relay electrode 221b is connected to the source 21c via the contact hole CH2. The relay electrode 221b is used to connect the source 21c of the TFT 21 to the data line 10 that is to be formed in the process described below.

An n-type amorphous semiconductor 222n, intrinsic amorphous semiconductor 222i, p-type amorphous semiconductor 222p are formed in this order through the CVD process. The n-type amorphous semiconductor 222n is made of amorphous silicon doped with an n-type impurity (such as phosphorus). The intrinsic amorphous semiconductor 222i is made of intrinsic amorphous silicon. The p-type amorphous semiconductor 222p is made of amorphous silicon doped with a p-type impurity (such as boron).

A transparent conductive film of indium tin oxide (ITO) is formed on the p-type amorphous semiconductor 222p, for example, through the sputtering process. The transparent conductive film is patterned through the photolithography process and wet etching processes (see FIG. 14G). In this way, the n-type amorphous semiconductor 222n, intrinsic amorphous semiconductor 222i, and p-type amorphous semiconductor 222p covering the lower electrode 221a and the relay electrode 221b are formed in the region A1. An upper electrode 223 that overlaps the lower electrode 221a in plan view is formed on the p-type amorphous semiconductor 222p. The n-type amorphous semiconductor 222n, intrinsic amorphous semiconductor 222i, and p-type amorphous semiconductor 222p are formed on the inorganic insulating film 112 in the region A2.

Figure 14H:
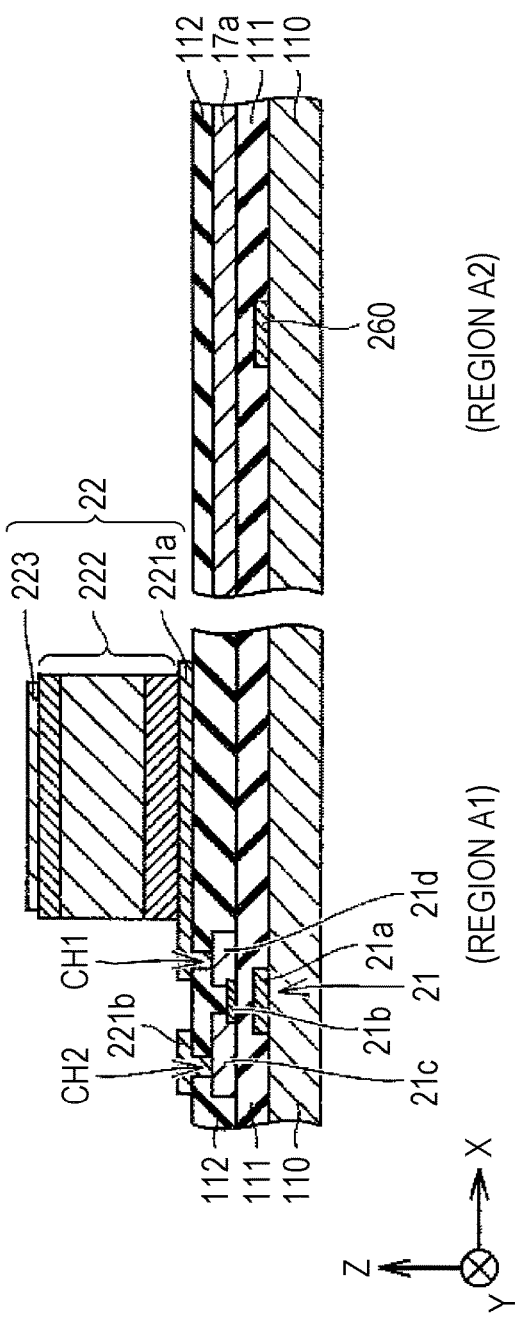
FIG. 14H is a sectional view illustrating the substrate in FIG. 14G on which the semiconductor layer in the regions A1 and A2 are patterned and a photoelectric conversion layer is formed in the region A1.
Figure 14I:
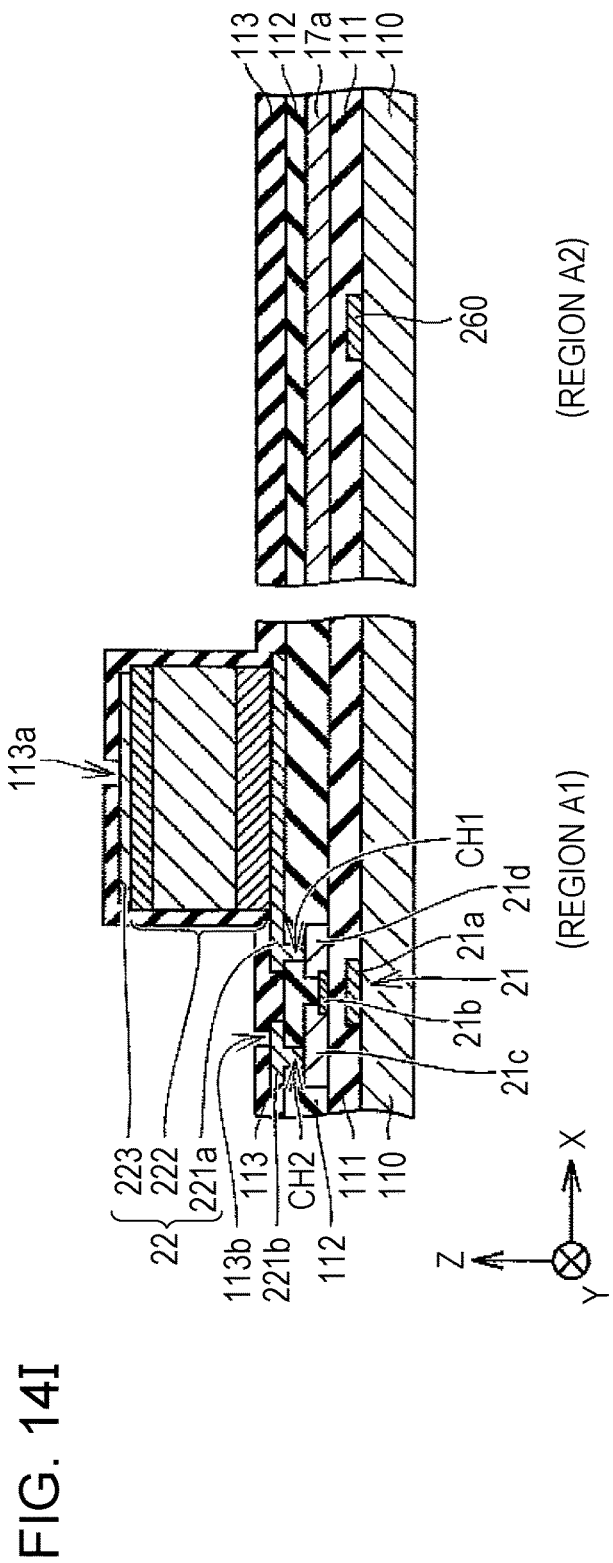
FIG. 14I is a sectional view illustrating the substrate in FIG. 14H on which the inorganic insulating film is formed in the regions A1 and A2.
Figure 14J:
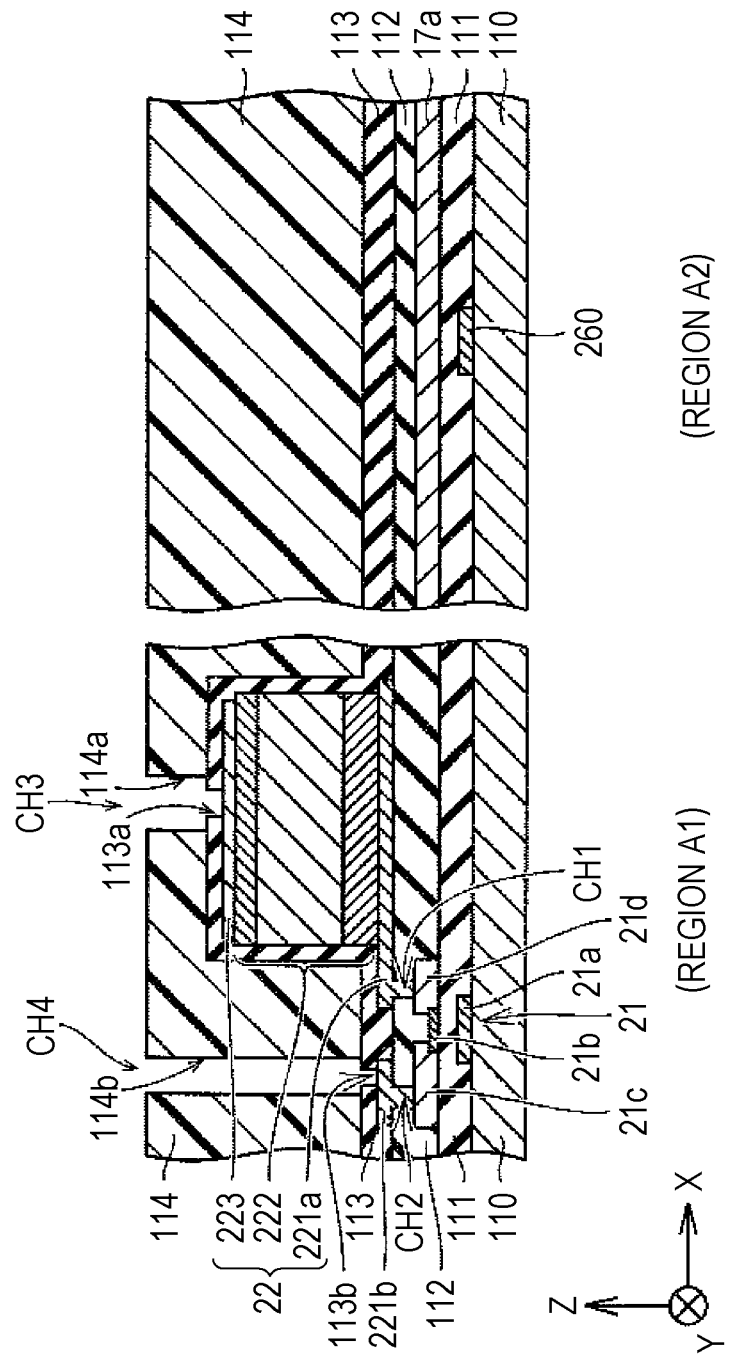
FIG. 14J is a sectional view illustrating the substrate in FIG. 14I on which a flattening film is formed in the regions A1 and A2.

The n-type amorphous semiconductor 222n, the intrinsic amorphous semiconductor 222i, and the p-type amorphous semiconductor 222p are patterned through the photolithography process and dry etching processes (see FIG. 14H). A photoelectric conversion layer 222 is formed between the lower electrode 221a and the upper electrode 223 in in the region A1.

An inorganic insulating film of silicon nitride (SiNx) is formed, for example, through the CVD process. The inorganic insulating film is patterned, for example, through the photolithography and dry etching processes (see FIG. 14I). An inorganic insulating film 113 is formed to cover a PIN photodiode 22 and the relay electrode 221b in the region A1. The inorganic insulating film 113 has openings 113a and 113b that respectively overlap the upper electrode 223 and the relay electrode 221b in plan view. The inorganic insulating film 113 is also formed on the inorganic insulating film 112 in the region A2.

A flattening film 114 of photosensitive acrylic resin is formed, for example, through the slit coating process. Through the photolithography process, the flattening film 114 is removed in locations that overlap the openings 113a and 113b of the inorganic insulating film 113 in plan view (see FIG. 14J). In this way, openings 114a and 114b of the flattening film 114 are formed in the locations that respectively overlap the openings 113a and 113b in plan view in the region A1. Specifically, a contact hole CH3 formed of the openings 113a and 114a is formed on the upper electrode 223 and a contact hole CH4 formed of the openings 113b and 114b is formed on the relay electrode 221b. The flattening film 114 is formed on the inorganic insulating film 113 in the region A2.

Metal films of titanium (Ti), aluminum (Al), and titanium (Ti) are laminated in this order through the sputtering process and the laminated metal films are then patterned through the photolithography process and dry etching processes (see FIG. 14K). The bias wiring 13 and the data line 10 are formed in the flattening film 114 in the region A1. The bias wiring 13 is connected to the upper electrode 223 via the contact hole CH3. The data line 10 is connected to the relay electrode 221b via the contact hole CH4. The data line 10 is connected to the relay electrode 221b and is thus connected to the source 21c of the TFT 21 via the relay electrode 221b.

Figure 14L:
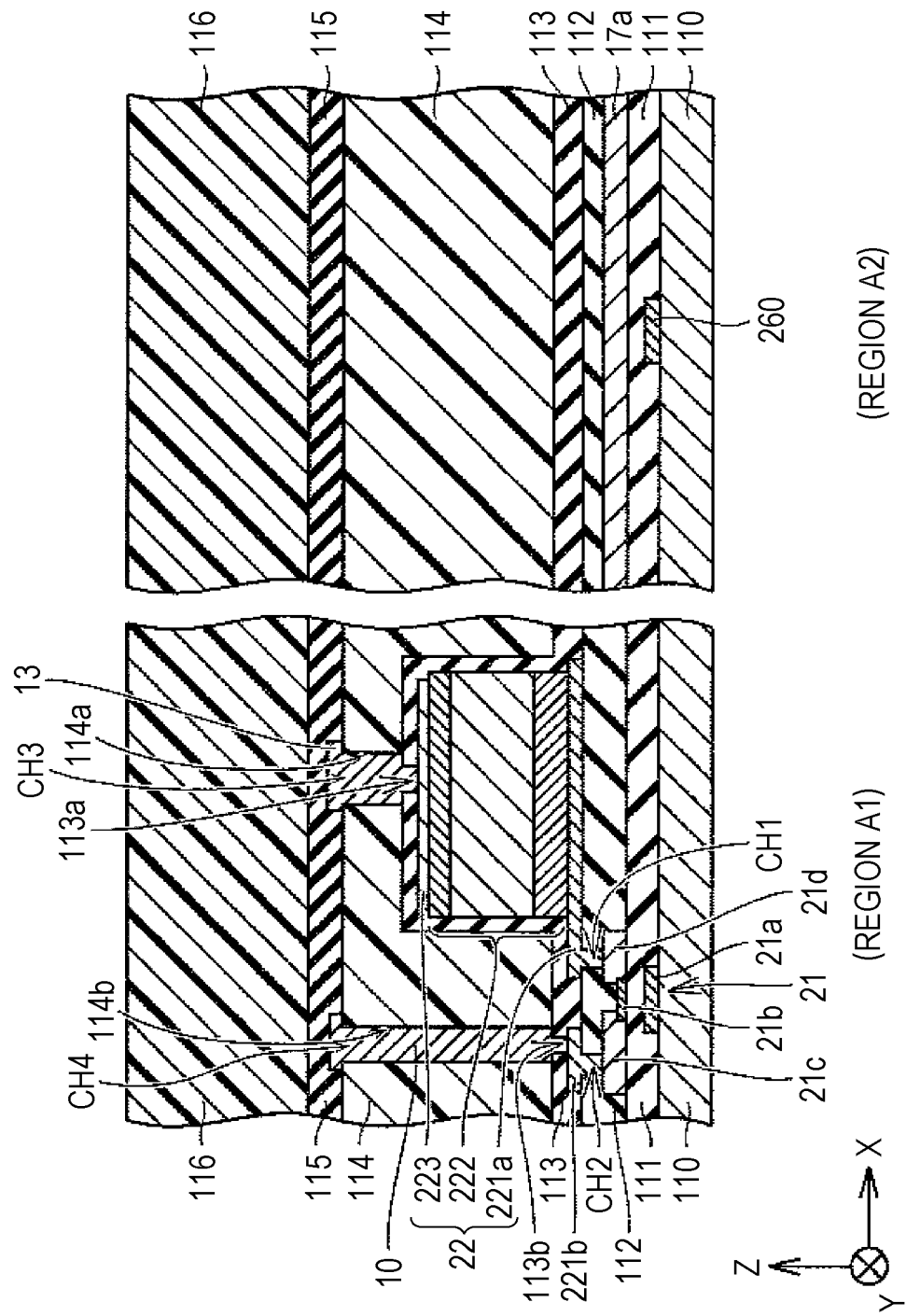
FIG. 14L is a sectional view illustrating the substrate in FIG. 14K on which as inorganic insulating film and a protective film are formed in the regions A1 and A2.

An inorganic insulating film of silicon nitride (SiNx) is formed through the CVD process and a protective film of photosensitive acrylic resin is formed on the inorganic insulating film through the slit coating process (see FIG. 14L). In this way, the inorganic insulating film 115 covering the data line 10 and the bias wiring 13 and the protective film 116 covering the inorganic insulating film 115 are formed on in the region A1 the imaging panel substrate assembly 110. The inorganic insulating film 115 is also formed on the flattening film 114 in the region A2 and the protective film 116 is formed on the inorganic insulating film 115 in the region A2.

Although the gate line 11 is not illustrated in FIG. 14A, the gate line 11 may be formed in the manufacturing process of the gate 21a of the TFT 21. Since the gate 21a is made of a relatively high resistance material, the gate line 11 may be formed in the same manufacturing process of the source 21c and the drain 21d which are made of a material lower in resistance than the gate 21a. In such case, a contact used to connect the gate line 11 to the gate 21a may be formed after the formation of the semiconductor layer 21b.

The non-linear elements 161a, 1601, and 1602 are made of the same material as that of the TFT 21 and are thus formed in the manufacturing process of the TFT 21 (see FIGS. 14A through 14D). Although the static protective wring 120 is not illustrated in FIG. 14D, not only the common wiring 17a but also the static protective wiring 120 is formed in the manufacturing process of the source 21c and the drain 21d. Specifically, after the first protective wiring 260 (see FIG. 14A) is formed, the common wiring 17a, the static protective wiring 120, and the non-linear elements 161a, 1601, and 1602 are formed (see FIG. 14D). Since the data line 10 is formed after the formation of the non-linear element 161a, the first protective wiring 260 is connected to the non-linear element 161a and the static protective wiring 120 when the data line 10 is formed. Even if static electricity is induced on the data line 10 after the data line 10 is formed, the static electricity may be drained to the static protective wiring 120 via the first protective wiring 260 or may be canceled by a charge from the common wiring 17a via the non-linear element 161a.

The first protective wiring 260 is formed in the manufacturing process of the gate 21a of the TFT 21. The manufacturing of the first protective wiring 260 is not limited to the manufacturing process of the gate 21a of the TFT 21. It is sufficient if the data line 10 is formed in a state that the first protective wiring 260 has been formed. In other words, it is sufficient if the first protective wiring 260 is formed in a layer closer to the substrate 110 than the data line 10. It is more desirable that the first protective wiring 260 and the static protective wiring 120 are formed before the manufacturing of the data line 10. In this way, even if static electricity is induced on the data line 10, the static electricity may be drained to the static protective wiring 120 via the first protective wiring 260.

The non-linear elements 161a, 1601, 1602, first protective wiring 260, and static protective wiring 120 are formed in the manufacturing process of the TFT 21 and the photoelectric conversion element 22 in the pixel P. For this reason, the manufacturing of the non-linear elements 161a, 1601, 1602, first protective wiring 260, and static protective wiring 120 does not involve a particular manufacturing step of their own.

In accordance with the eighth embodiment, the imaging panel substrate assembly 110 of the fourth embodiment has been quoted (see FIG. 8). The manufacturing process described with reference to the eighth embodiment may be applied to the manufacturing of the imaging panel substrate assemblies in FIGS. 9 through 12. By manufacturing the non-linear elements 3601 and 3602 in the imaging panel substrate assemblies in FIGS. 9 through 12 of the same material as that of the TFT 21, the non-linear elements 3601 and 3602 may be formed in the manufacturing process of the TFT 21.

In the eighth embodiment, the gate insulating film 111 may be formed and then patterned through the photolithography and dry etching processes. For example, in the case described below, the gate insulating film 111 is patterned. When the data terminal 151 is formed on the source layer with the source 21c and the gate line 11 arranged therein, a contact hole is formed in the gate insulating film 111 to connect the data terminal 151 to the first protective wiring 260 formed in the gate layer having the gate 21a. In such a case, the contact hole that connects the gate layer to the source layer is formed by patterning the gate insulating film 111 through the photolithography and dry etching processes after forming the gate insulating film 111.

Ninth Embodiment

Figure 15:
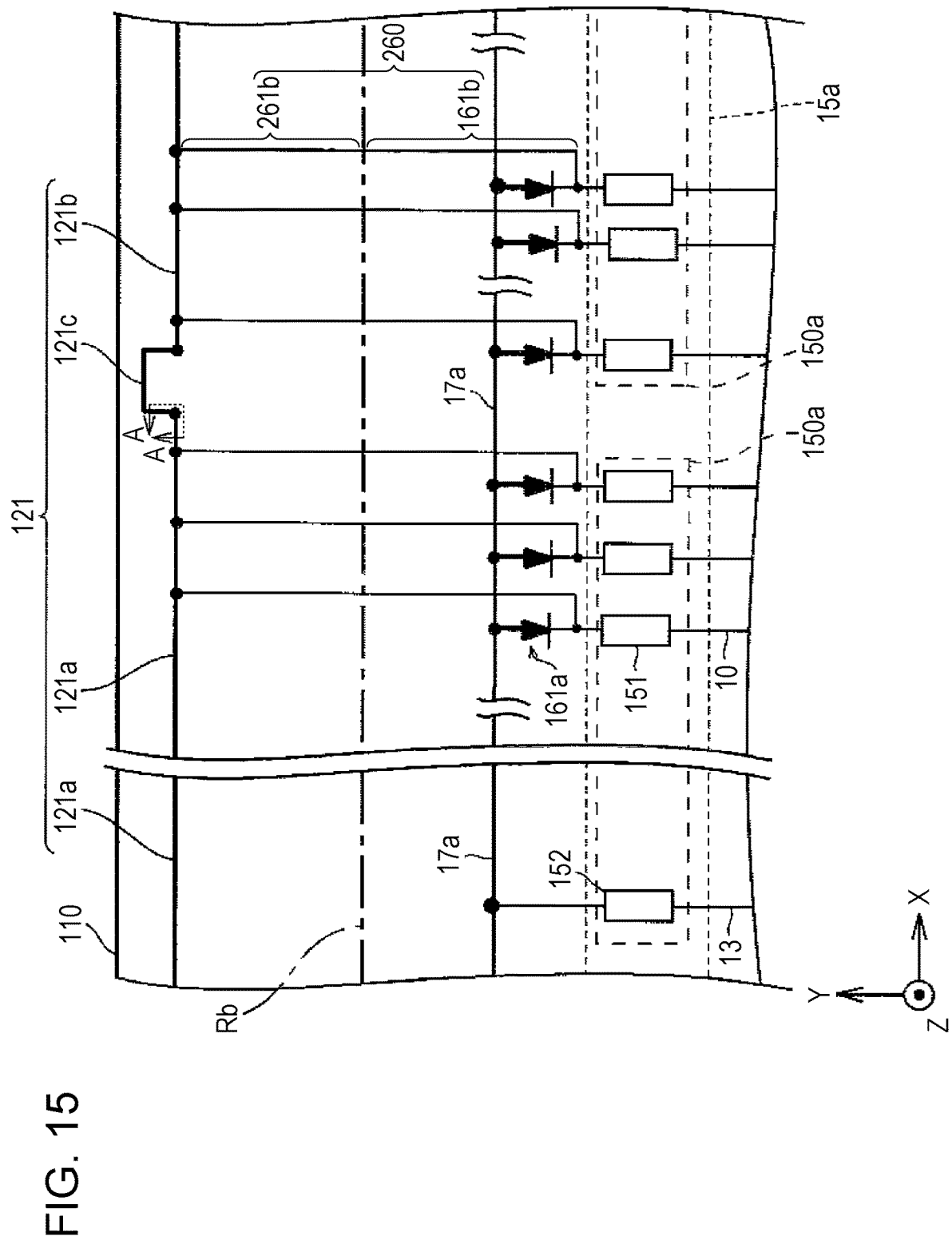
FIG. 15 is a plan view schematically illustrating a portion of an imaging panel substrate assembly of a ninth embodiment.

In accordance with the eighth embodiment, the static protective wiring 120 continuously extends. As the static protective wiring 120 extends longer, it may more easily induce static electricity. In accordance with a ninth embodiment, multiple wirings (hereinafter referred to as a partial static protective wiring shorter than the static protective wiring 120 are mounted and a wiring (hereinafter referred to as a relay protective wiring) made of a material different from the materials of the partial static wirings is mounted to connect adjacent wirings. FIG. 15 is a plan view schematically illustrating in enlargement a portion of the imaging panel substrate assembly of the ninth embodiment. Referring to FIG. 15, elements identical to those in FIG. 8 are designated with the same reference numerals.

Referring to FIG. 15, a static protective wiring 121 of the ninth embodiment includes partial static protective wirings 121a and 121b and a relay protective wiring 121c connecting the partial static protective wirings 121a and 121b. The partial static protective wirings 121a and 121b are arranged for each of the terminal tabs 150a and the relay protective wiring 121c is arranged at a location between mutually adjacent terminal tabs 150a.

Figure 16:
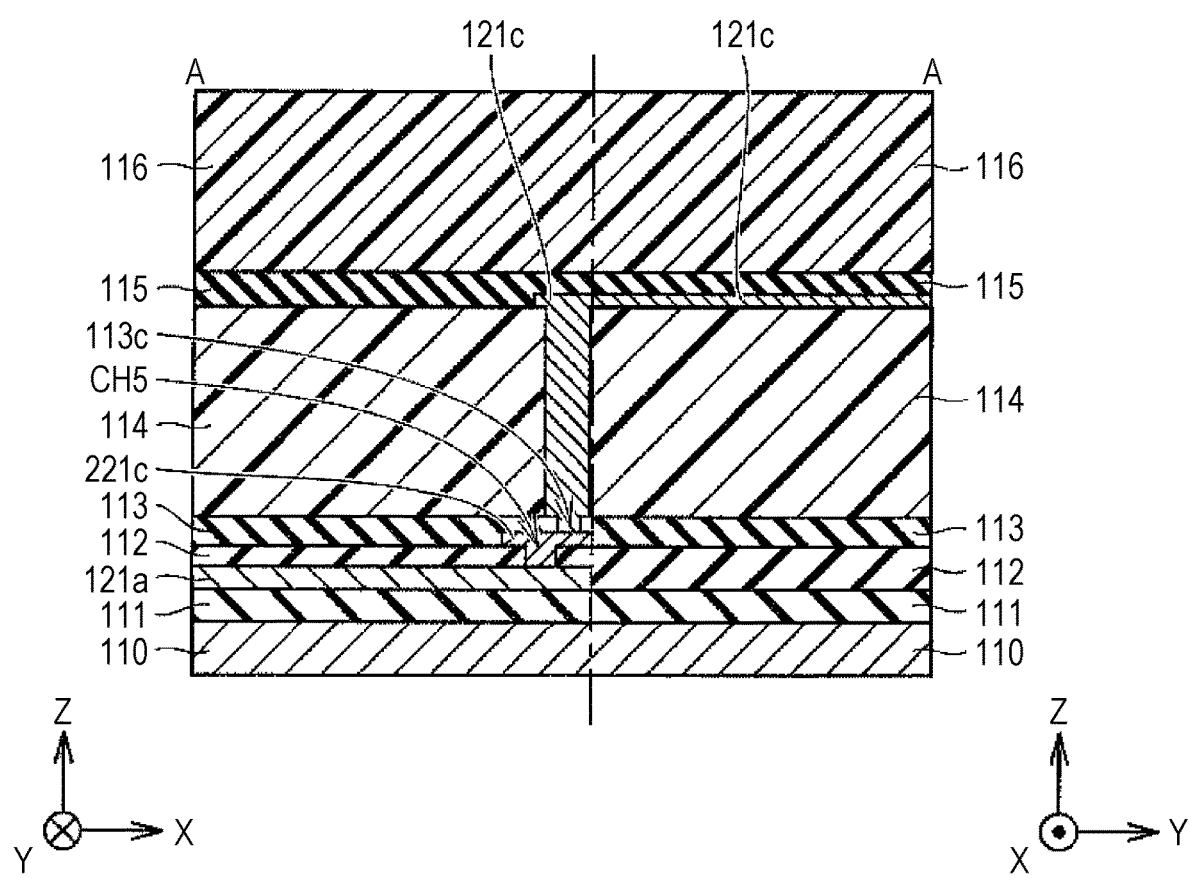
FIG. 16 is a sectional view taken along line A-A in FIG. 15.

FIG. 16 is a partial sectional view along line A-A in FIG. 15. Referring to FIG. 16, elements identical to those in FIG. 14L are designated with the same reference numerals.

The partial static protective wiring 121a is arranged in the same layer as the source 21c and the drain 21d on the gate insulating film 111.

The inorganic insulating film 112 is formed on the partial static protective wiring 121 a and the inorganic insulating film 112 has a contact hole CH5 at a location overlapping the partial static protective wiring 121 a in plan view.

A conductive member 221c (hereinafter referred to as a relay electrode 221c) made of the same material as that of the lower electrode 221a is mounted on the inorganic insulating film 112. The relay electrode 221c is connected to the partial static protective wiring 121 a via the contact hole CE-5.

The inorganic insulating film 113 is formed on the relay electrode 221c and the inorganic insulating film 113 has an opening 113c at a location overlapping the relay electrode 221c in plan view.

The flattening film 114 is formed on the inorganic insulating film 113 and the relay protective wiring 121c made of the same material as that of the data lines 10 and the bias wirings 13 is formed on the flattening film 114. The relay protective wiring 121c is connected to the relay electrode 221c via the opening 113c.

Since the static protective wiring 121 is not a single unitary wiring, static electricity may be less induced on the static protective wiring 121 than on the static protective wiring 120.

Modifications of the embodiments of the disclosure are described below.
First Modification In accordance with the embodiments described above, the drain of the TFT 21 is connected to the cathode of the photoelectric conversion element 22 and the anode of the photoelectric conversion element 22 is connected to the branch bias wiring 131. The connection of the anode and cathode of the photoelectric conversion element 22 may be reversed. Specifically, the anode of the photoelectric conversion element 22 is connected to the drain of the TFT 21 and the cathode of the photoelectric conversion element 22 is connected to the branch bias wiring 131. In such a case, the non-linear element 161a is connected between the common wiring 17a and the data terminal 151 such that the forward direction of the non-linear element 161a is opposite from the forward direction of the non-linear element 161a in the embodiments. During imaging, the bias wiring 13 and the branch bias wiring are biased such that the photoelectric conversion element 22 and the non-linear element 161a are reverse-biased.
Second Modification In accordance with the eighth embodiment, the non-linear element 161a is the n-channel TFT. Alternatively, the non-linear element 161a may be the p-channel TFT. In such a case, the p-channel TFT is supplied with the voltage reverse to the voltage supplied to the n-channel TFT.
Third Modification An inspection terminal used to inspect an imaging operation may be mounted on the terminal tabs 150a and 150b. The inspection terminal may be used not only during imaging but also during the manufacturing process of the imaging panel.
Fourth Modification In the imaging panels described above, the common wiring 17a is arranged closer to the border of the imaging panel region Rb than the non-linear element 161a in plan view. The common wring 17a may be arranged between the non-linear element 161a and the data terminals 151 in plan view. The electrical connection configuration of the non-linear elements 161a, common wiring 17a, and data terminals 151 remains unchanged from the electrical connection configuration in the embodiments described above. Specifically, the anode of the non-linear element 161a is connected to the common wiring 17a and the cathode of the non-linear element 161a is connected to the data terminal 151 such that the direction from the common wiring 17a to the data terminal 151 is aligned with the forward direction of the non-linear element 161a.

Fifth Modification

Figure 17:
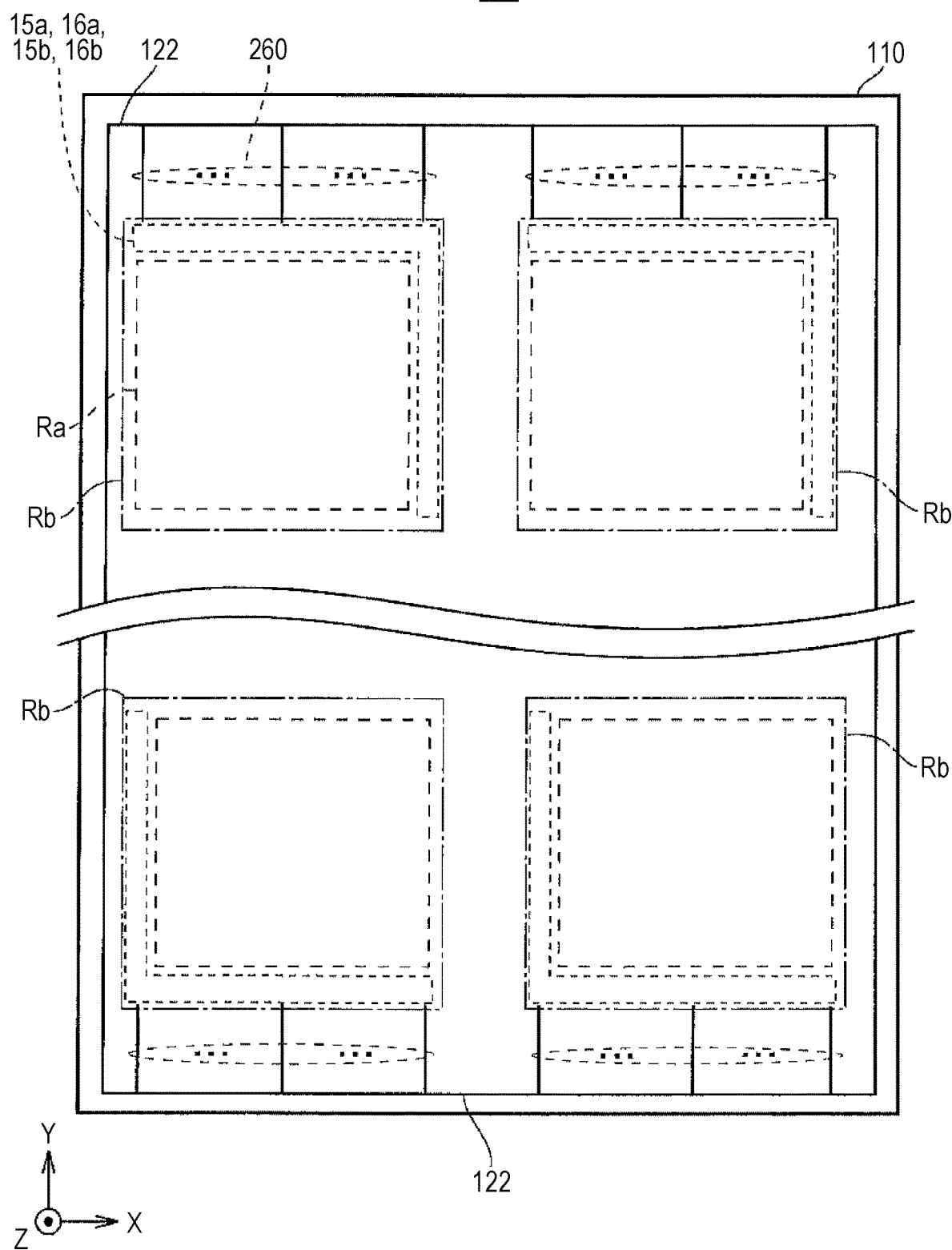
FIG. 17 is a plan view illustrating a portion of an imaging panel substrate assembly of a fifth modification.

In the imaging panel substrate assembly 100 of the fourth embodiment, the static protective wiring 120 is arranged along the periphery of each imaging panel region Rb. The layout of the static protective wiring 120 is not limited to this arrangement. For example, as illustrated in FIG. 17, a static protective wiring 122 may be arranged along the periphery of the substrate 110 of the imaging panel substrate assembly 100. Specifically, the static protective wiring 122 may be commonly shared by all the imaging panel regions Rb.

The imaging panel and the imaging panel substrate assembly are configured as described below.

According to a first aspect of the disclosure, there is provided an imaging panel. The imaging panel includes a substrate, multiple gate lines mounted on the substrate, multiple data lines crossing the gate lines, multiple photoelectric conversion elements respectively mounted in multiple pixels defined by the gate lines and the data lines, multiple first non-linear elements that are mounted outside pixel regions defined by the pixels on the substrate and are respectively connected to the data lines, multiple first protective wirings mounted out the pixel regions on the substrate and having first ends respectively connected to the data lines, and a first common wiring connected to the first non-linear elements. Each of the first non-linear elements is connected in a reverse-biased state between the data line connected to the first non-linear element and the first common wiring and the first protective wirings extend to and have second ends at or near an edge of the substrate.

According to the first aspect, the photoelectric conversion element is arranged for each of the pixels formed on the substrate. Arranged outside the pixel regions on the substrate are the first non-linear elements, the first protective wirings, and the first common wiring. The first non-linear elements are respectively connected to the data lines. Each non-linear element is connected in a reverse-biased state between the data line connected thereto and the first common wiring. If static electricity is induced on a data line, the static electricity is canceled by a charge from the first common wiring via the first non-linear element in response to the polarity of the static electricity. Each first protective wiring has the first end connected to the data line and the second end extending to the edge of the substrate. Even if static electricity regardless of being positive or negative is induced on the data line with the second end of the first protective wiring exposed to the atmosphere, the static electricity flows to the first protective wiring. The charge of the static electricity having flown into the first protective wiring is drained to the atmosphere. The data lines may be less susceptible to static breakdown even if static electricity regardless of being positive or negative is induced on the data line.

The imaging panel of a second aspect of the document of the disclosure in view of the first aspect may further include a bias wiring connected to the photoelectric conversion elements on the substrate. The first common wiring is connected to the bias wiring such that the photoelectric conversion elements are reverse-biased.

According to the second aspect, the photoelectric conversion elements are connected to the bias wiring and the bias wiring is connected to the first common wiring that is supplied with a voltage that causes the photoelectric conversion element to be reverse-biased. This configuration is free from a power supply that feeds to the bias wiring a bias voltage that causes the photoelectric conversion element to be reverse-biased.

The imaging panel of a third aspect of the disclosure in view of the second aspect may further include a second non-linear element that is mounted outside the pixel regions on the substrate and is connected in a reverse-biased state between the bias wiring and the first common wiring and a second protective wiring that is mounted outside the pixel regions on the substrate and has a first end connected to the bias wiring and the second non-linear element. The second protective wiring extends to and has a second end at or near the edge of the substrate.

According to the third aspect, the second non-linear element is connected in a reverse-biased state between the bias wiring and the first common wiring and the second protective wiring is connected between the bias wiring and the second non-linear element. If static electricity is induced on the bias wiring, the static electricity is drained to the first common wiring via the second non-linear element in response to the polarity of the static electricity. The static electricity regardless of being positive or negative flows to the second protective wiring. The second protective wiring extends to and has the second end at or near the edge of the substrate. The charge of static electricity having flown to the second protective wiring is dissipated to the atmosphere to some extent with the second end of the second protective wiring exposed to the atmosphere. The bias line may be less susceptible to static breakdown even if static electricity regardless of being positive or negative is induced on the bias line.

The imaging panel of a fourth aspect of the disclosure in view of one of the first through third aspects may further include a second common wiring mounted outside the pixel regions on the substrate and multiple third non-linear elements mounted outside the pixel regions on the substrate and respectively connecting the first protective wirings to the second common wiring. Each of the third non-linear elements is connected in a forward-biased state between the first protective wiring connected thereto and the second common wiring.

According to the fourth aspect, each third non-linear is connected in a forward-biased state between each first protective wiring and the second common wiring. Static electricity induced on a data line is thus drained to the second common wiring via the third non-linear element in response to the polarity of the static electricity. The data lines may be less susceptible to static breakdown more than when the configuration in the fourth aspect is not employed.

The imaging panel of a fifth aspect of the disclosure in view of one of the first through fourth aspects may further include multiple gate line protective circuits mounted outside the pixel regions on the substrate and respectively connected to the gate lines and a third common wiring mounted outside the pixel regions on the substrate and connected to the gate line protective circuits. Each of the gate line protective circuits includes a pair of mutually connected non-linear elements. One of the non-linear elements is connected in a reverse-biased state between the crate line connected to the one of the non-linear elements and the third common wiring. The other of the non-linear elements is connected in a forward-biased state between the gate line connected to the other of the non-linear elements and the third common wiring.

According to the fifth aspect, arranged outside the pixel regions on the substrate are the gate line protective circuits respectively connected to the gate lines with each gate line protective circuit including the pair of non-linear units and the third common wiring connected to the gate line protective circuits. The pair of non-linear units are connected between the gate line and the third common wiring such that the forward direction of the first non-linear unit and the forward direction of the second non-linear unit are opposite to each other. Even if static electricity is induced on a gate line, depending on the polarity of the static electricity, the static electricity is drained to the third common wiring via one of the non-linear units in the pair or is canceled by a charge from the third common wiring via the other of the no unit. The gate line may be less susceptible to static breakdown even if static electricity regardless of being positive or negative is induced on the gate line.

According to a sixth a sixth aspect of the disclosure, there is provided an imaging panel substrate assembly. The imaging panel substrate assembly includes a substrate, one or more imaging panel regions formed on the substrate, and a static protective wiring mounted outside the one or more imaging panel regions. The one or more imaging panel regions include multiple gate lines, multiple data lines crossing the gate lines, multiple photoelectric conversion elements respectively mounted in multiple pixels defined by the gate lines and the data lines, multiple first non-linear elements that are mounted outside pixel regions defined by the pixels and are respectively connected to the data lines, multiple first protective wirings mounted outside the pixel regions and respectively connected to the data lines, and a first common wiring mounted outside the pixel regions and connected to the first non-linear elements. Each of the first non-linear elements is mounted such that a direction from the first common wiring to the data line connected to the first non-linear element is aligned with a forward direction of the first non-linear element. The first protective wirings extend from within the imaging panel region to the static protective wiring and are connected to the static protective wiring.

According to the sixth aspect, the imaging panel substrate assembly includes the one or more imaging panel regions formed on the substrate, and the static protective wiring mounted outside the one or more imaging panel regions. The pixels defined by the gate lines and the data lines are formed on the imaging panel region and each pixel includes a photoelectric conversion element. The first non-linear elements, the first protective wirings, and the first common wiring are formed outside the pixel regions in the imaging panel region. Each of the first non-linear elements is connected between a corresponding data line and the first common wiring such that the direction from the first common wiring to the data line is aligned with the forward direction of the first non-linear element. The first protective wiring connects a corresponding data line to the static protective wiring. If static electricity is induced on the data line, depending on the polarity of the static electricity, the static electricity is canceled by a charge having a polarity reverse to the induced static electricity. The static electricity induced on the data line regardless of being positive or negative flows to the static protective wiring via the first protective wiring and dissipated to the first protective wirings via the static protective wiring. The data line may be less susceptible to static breakdown even if static electricity regardless of being positive or negative is induced on the data line.

The imaging panel substrate assembly of a seventh aspect of the disclosure in view of the sixth aspect may further include multiple protective circuits mounted outside the one or more imaging panel regions on the substrate and respectively connecting the first protective wirings to the static protective wiring. Each of the protective circuits includes a second non-linear element connected between the first protective wiring connected to the protective circuit and the static protective wiring. The second non-linear element is mounted such that a direction from the first protective wiring connected to the second non-linear element to the static protective wiring is aligned with a forward direction of the second non-linear element.

According to the seventh aspect, the protective circuit including the second non-linear element connected between the first protective wiring and the static protective wiring. The second non-linear element is arranged such that the current flowing from the first protective wiring to the static protective wiring is in a forward direction of the second non-linear element. If static electricity is induced on a data line, the corresponding second non-linear element may be forward-biased depending on the polarity of the static electricity and the charge of the static electricity may be drained from the first protective wiring to the static protective wiring via the second non-linear element. Since charge is difficult to flow from the static protective wiring via the second non-linear element, the static electricity having flown to the static protective wiring is difficult to flow from the first protective wiring to the data line.

In the imaging panel substrate assembly of an eighth aspect of the disclosure in view of the seventh aspect, each of the protective circuits may further include a third non-linear element connected between the first protective wiring connected to the protective circuit and the static protective wiring. The second non-linear element and the third non-linear element are mounted such that a forward direction of the second non-linear element and a forward direction of the third non-linear element are mutually opposite to each other.

According to the eighth aspect, each of the protective circuits includes the second non-linear element and the third non-linear element. The second non-linear element and the third non-linear element are mounted such that the forward direction of the second non-linear element and the forward direction of the third non-linear element are mutually opposite to each other. In this configuration, static electricity having flown to the static protective wiring from the second non-linear element may be dissipated, depending on the polarity of the charge of static electricity, to the first protective wirings via the third non-linear elements connected to the static protective wiring.

The imaging panel substrate assembly of a ninth aspect of the disclosure in view of one of the seventh and eighth aspects may further include a relay wiring that connects the static protective wiring to the first common wiring.

According to the ninth aspect, the relay wiring connects the static protective wiring to the first common wiring. Static electricity having flown to the static protective wiring via the first protective wiring flows to the first common wiring via the relay wiring and is dissipated to the data lines via the first non-linear elements connected to the first common wiring.

In the imaging panel substrate assembly of a tenth aspect of the disclosure in view of one of the sixth through ninth aspects, the static protective wiring may further include multiple partial wirings separated from each other and a relay protective wiring that connects the partial wirings that are next to each other.

According to the tenth aspect, the static protective wiring is formed by connecting partial wirings separated from each other with the relay wiring. Static electricity is less likely to be induced on the static protective wiring than when the static protective wiring has a single unitary wiring structure.

In the imaging panel substrate assembly of an eleventh aspect of the disclosure in view of one of sixth through tenth aspects, the first protective wirings may be mounted in a layer closer to the substrate than the data lines on the substrate.

According to the eleventh aspect, the first protective wirings are mounted in the layer closer to the substrate than the data lines. Specifically, the first protective wirings are formed on the substrate before the formation of the data lines. Even if static electricity is induced on the data lines after the manufacturing of the data lines in the manufacturing process of the imaging panel substrate assembly, the static electricity may be drained to the static protective wiring via the first protective wiring. The imaging panel substrate assembly may thus be manufactured in a manner free from electrostatic breakdown to the data lines.

The imaging panel substrate assembly of twelfth aspect of the disclosure in view of one of first through sixth aspects may further include a scintillator that covers the pixels and converts irradiated X rays into fluorescence.

According to the twelfth aspect, the first non-linear element is connected in a reverse-biased state and current is difficult to flow from the data line to the first common wiring. The amount of charge flowing through the data line is smaller than static electricity during imaging. Even if charge flows from the data line to the first protective wiring, the charge is difficult to be drained from the end of the first protective wiring to the atmosphere. The data lines are thus protected while an electrical signal responsive to a charge into which fluorescence radiated to the pixels is converted is appropriately read from the data lines.

The imaging panel substrate assembly of a thirteenth aspect of the disclosure in view of the twelfth aspect may further include a driving circuit that causes the gate lines to scan and a reading circuit that reads, through the data lines, charges responsive to fluorescence from the scintillator.

According to the thirteenth aspect, an electrical signal responsive to charge obtained at each pixel is appropriately read from each data line in a manner tree from the effect of static electricity. The detection accuracy of X-rays may thus be increased.

The present disclosure contains subject matter related to that disclosed in Japanese Priority Patent Application JP 2019-060487 filed in the Japan Patent Office on Mar. 27, 2019, the entire contents of which are hereby Incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An imaging panel comprising:
   a substrate;
   a plurality of gate lines mounted on the substrate;
   a plurality of data lines crossing the gate lines;
   a plurality of photoelectric conversion elements respectively mounted in a plurality of pixels defined by the gate lines and the data lines;
   a reading circuit configured to read a charge from each of the data lines;
   a plurality of data terminals provided at an end of the plurality of data lines, respectively, and connected to the reading circuit;
   a plurality of first non-linear elements that are mounted outside pixel regions defined by the pixels on the substrate and are respectively connected to the data terminals, the first non-linear elements being positioned closer to an edge of the substrate than the data terminals are;
   a plurality of first protective wirings mounted outside the pixel regions on the substrate and having first ends respectively connected between the data terminals and the first non-linear elements; and
   a first common wiring connected to the first non-linear elements,
   wherein each of the first non-linear elements is connected in a reverse-biased state between the data line connected to the first non-linear element and the first common wiring, and wherein the first protective wirings extend to and respectively have second ends at or near the edge of the substrate.

2. The imaging panel according to claim 1, further comprising a bias wiring connected to the photoelectric conversion elements on the substrate, wherein the first common wiring is connected to the bias wiring such that the photoelectric conversion elements are reverse-biased.

3. The imaging panel according to claim 2, further comprising a second non-linear element that is mounted outside the pixel regions on the substrate and is connected in a reverse-biased state between the bias wiring and the first common wiring and a second protective wiring that is mounted outside the pixel regions on the substrate and has a first end connected to the bias wiring and the second non-linear element, wherein the second protective wiring extends to and has a second end at the edge of the substrate.

4. The imaging panel according to claim 1, further comprising a plurality of gate line protective circuits mounted outside the pixel regions on the substrate and respectively connected to the gate lines and a third common wiring mounted outside the pixel regions on the substrate and connected to the gate line protective circuits, wherein each of the gate line protective circuits includes a pair of non-linear elements, wherein one of the non-linear elements is connected in a reverse-biased state between the gate line connected to the one of the non-linear elements and the third common wiring, and wherein the other of the non-linear elements is connected in a forward-biased state between the gate line connected to the other of the non-linear elements and the third common wiring.

5. The imaging panel substrate assembly according to claim 1, further comprising a scintillator that covers the pixels and converts radiated X rays into fluorescence.

6. The imaging panel substrate assembly according to claim 5, further comprising a driving circuit that causes the gate lines to scan and a reading circuit that reads, through the data lines, charges responsive to fluorescence from the scintillator.

7. An imaging panel comprising:
   a substrate;
   a plurality of gate lines mounted on the substrate;
   a plurality of data lines crossing the gate lines;
   a plurality of photoelectric conversion elements respectively mounted in a plurality of pixels defined by the gate lines and the data lines;

a plurality of first non-linear elements that are mounted outside pixel regions defined by the pixels on the substrate and are respectively connected to the data lines;

a plurality of first protective wirings mounted outside the pixel regions on the substrate and having first ends respectively connected to the data lines;

a first common wiring connected to the first non-linear elements;

a second common wiring mounted outside the pixel regions on the substrate; and a plurality of third non-linear elements mounted outside the pixel regions on the substrate and respectively connecting the first protective wirings to the second common wiring, wherein each of the first non-linear elements is connected in a reverse-biased state between the data line connected to the first non-linear element and the first common wiring, wherein the first protective wirings extend to and have second ends at or near an edge of the substrate, and wherein each of the third non-linear elements is connected in a forward-biased state between the first protective wiring connected to the third non-linear element and the second common wiring.

8. An imaging panel substrate assembly comprising:

a substrate;

one or more imaging panel regions formed on the substrate; and a static protective wiring mounted outside the one or more imaging panel regions, wherein the one or more imaging panel regions include a plurality of gate lines, a plurality of data lines crossing the gate lines, a plurality of photoelectric conversion elements respectively mounted in a plurality of pixels defined by the gate lines and the data lines, a plurality of first non-linear elements that are mounted outside pixel regions defined by the pixels and are respectively connected to the data lines, a plurality of first protective wirings mounted outside the pixel regions and respectively connected to the data lines, and a first common wiring mounted outside the pixel regions and connected to the first non-linear elements, wherein each of the first non-linear elements is mounted such that a direction from the first common wiring to the data line connected to the first non-linear element is aligned with a forward direction of the first non-linear element and wherein the first protective wirings extend from within the imaging panel region to the static protective wiring and are connected to the static protective wiring.

9. The imaging panel substrate assembly according to claim 8, further comprising a plurality of protective circuits mounted outside the one or more imaging panel regions on the substrate and respectively connecting the first protective wirings to the static protective wiring, wherein each of the protective circuits includes a second non-linear element connected between the first protective wiring connected to the protective circuit and the static protective wiring, and wherein the second non-linear element is mounted such that a direction from the first protective wiring connected to the second non-linear element to the static protective wiring is aligned with a forward direction of the second non-linear element.

10. The imaging panel substrate assembly according to claim 9, wherein each of the protective circuits further comprises a third non-linear element connected between the first protective wiring connected to the protective circuit and the static protective wiring, wherein the second non-linear element and the third non-linear element are mounted such that a forward direction of the second non-linear element and a forward direction of the third non-linear element are mutually opposite to each other.

11. The imaging panel substrate assembly according to claim 9, further comprising a relay wiring that connects the static protective wiring to the first common wiring.

12. The imaging panel substrate assembly according to claim 8, wherein the static protective wiring comprises a plurality of partial wirings separated from each other and a relay protective wiring that connects the partial wirings that are next to each other.

13. The imaging panel substrate assembly according to claim 8, wherein the first protective wirings are mounted in a layer closer to the substrate than the data lines on the substrate.

* * * * *